US011156409B2

(12) United States Patent
Zhang et al.

(10) Patent No.: US 11,156,409 B2
(45) Date of Patent: Oct. 26, 2021

(54) COOLANT-COOLED HEAT SINKS WITH INTERNAL THERMALLY-CONDUCTIVE FINS JOINED TO THE COVER

(71) Applicant: INTERNATIONAL BUSINESS MACHINES CORPORATION, Armonk, NY (US)

(72) Inventors: Hongqing Zhang, Hopewell Junction, NY (US); Jay A. Bunt, Esopus, NY (US); David J. Lewison, LaGrangeville, NY (US); Joyce E. Molinelli Acocella, Poughquag, NY (US); Frank L. Pompeo, Redding, CT (US); Jeffrey Allen Zitz, Poughkeepsie, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/747,059

(22) Filed: Jan. 20, 2020

(65) Prior Publication Data

US 2021/0222956 A1 Jul. 22, 2021

(51) Int. Cl.
*H05K 7/20* (2006.01)
*F28D 15/02* (2006.01)
*F28D 15/04* (2006.01)

(52) U.S. Cl.
CPC ......... *F28D 15/0275* (2013.01); *F28D 15/04* (2013.01); *H05K 7/2039* (2013.01); *H05K 7/20336* (2013.01); *H05K 7/20809* (2013.01)

(58) Field of Classification Search
None
See application file for complete search history.

(56) References Cited

U.S. PATENT DOCUMENTS 4,137,369 A 1/1979 Chaikin
4,416,408 A 11/1983 Spirig
(Continued)

FOREIGN PATENT DOCUMENTS

JP 2006-041024 A 9/2006
WO WO 2017/127447 A1 7/2017

OTHER PUBLICATIONS

Kang, SK et al., "Thermal Sponge", IBM Prior Art Database Technical Disclosure, IPCOM000039093D (Feb. 1, 2005) (3 pages).

*Primary Examiner* — Courtney L Smith
(74) *Attorney, Agent, or Firm* — Tihon Poltavets, Esq.; Kevin P. Radigan, Esq.; Heslin Rothenberg Farley & Mesiti P.C.

(57) ABSTRACT

Coolant-cooled heat sinks and methods of fabrication are provided with a coolant-carrying compartment between a cover and a heat transfer base. The heat transfer base includes a heat transfer surface to couple to a component to be cooled, and a plurality of thermally-conductive fins extending into the coolant-carrying compartment from a surface of the heat transfer base opposite to the heat transfer surface. One or more grooves are provided in an interface surface of the cover and fins, and wicking element(s) are positioned within, at least in part, the groove(s). A joining material is provided between the cover and fins to join the plurality of thermally-conductive fins to the cover. The wicking element(s) within, at least in part, the groove(s) facilitate retaining the joining material over the plurality of thermally-conductive fins during joining of the cover and fins.

20 Claims, 15 Drawing Sheets

(56) References Cited

U.S. PATENT DOCUMENTS

| | | |
|---|---|---|
| 4,616,699 A | 10/1986 | Grote |
| 4,843,693 A | 7/1989 | Chisholm |
| 5,309,321 A | 5/1994 | Olla et al. |
| 5,558,155 A | 9/1996 | Ito |
| 5,998,240 A * | 12/1999 | Hamilton ............... H01L 23/473 |
| | | 257/714 |
| 6,085,833 A | 7/2000 | Kimura et al. |
| 6,637,109 B2 | 10/2003 | Nyqvist |
| 6,653,741 B2 | 11/2003 | Sreeram et al. |
| 6,899,165 B1 * | 5/2005 | Wu ..................... F28D 15/0233 |
| | | 165/104.21 |
| 7,124,809 B2 | 10/2006 | Rosenfeld et al. |
| 7,137,443 B2 | 11/2006 | Rosenfeld et al. |
| 7,361,978 B2 | 4/2008 | Stephens |
| 7,562,444 B2 * | 7/2009 | Vetter .................... B23K 11/14 |
| | | 29/832 |
| 9,439,325 B2 | 9/2016 | Campbell et al. |
| 9,504,184 B2 * | 11/2016 | Krug, Jr. ............. H05K 7/20218 |
| 9,544,988 B2 * | 1/2017 | Suzuki ................ F28D 15/0266 |
| 10,721,838 B1 * | 7/2020 | Bhatia ................ H05K 7/20336 |
| 10,842,043 B1 * | 11/2020 | Zhang ................... F28D 1/0316 |
| 2008/0087456 A1 | 4/2008 | Schuette |
| 2008/0128898 A1 * | 6/2008 | Henderson ............ F28D 15/043 |
| | | 257/713 |
| 2008/0230208 A1 * | 9/2008 | Rasmussen ........... H01L 23/473 |
| | | 165/80.4 |
| 2009/0269521 A1 | 10/2009 | Tuma |
| 2010/0101253 A1 * | 4/2010 | Searle ................... F25D 31/002 |
| | | 62/259.3 |
| 2011/0272122 A1 | 11/2011 | Corbeil et al. |
| 2014/0198452 A1 * | 7/2014 | Brunschwiler ........ H05K 13/00 |
| | | 361/699 |
| 2018/0306522 A1 * | 10/2018 | Nelson ................. F28D 15/046 |
| 2020/0068744 A1 * | 2/2020 | Bodenweber ...... H05K 7/20263 |

* cited by examiner

COOLANT-COOLED HEAT SINKS WITH INTERNAL THERMALLY-CONDUCTIVE FINS JOINED TO THE COVER

BACKGROUND

Operating electronic components produce heat, which needs to be removed in an effective manner in order to maintain device junction temperatures within desirable limits, with failure to do so resulting in excessive component temperatures, potentially leading to thermal runaway conditions. Several trends in the electronics industry combine to increase the importance of thermal management, including in technologies where thermal management has traditionally been less of a concern. In particular, the need for faster and more densely packed circuits has had a direct impact on the importance of thermal management. For instance, power dissipation, and therefore heat production, increases as device operating frequencies increase. Also, increased operating frequencies are possible at lower device junction temperatures. Further, as more and more components are packed onto a single chip, heat flux (Watts/cm$^2$) increases, resulting in the need to dissipate more power from a given sized chip, module, or system. These trends have combined to create applications where traditional air-cooling methods alone, such as methods using air-cooled heat sinks with heat pipes or vapor chambers, are unable to remove sufficient heat.

The need to cool current and future high-heat load, high-heat flux electronic components thus mandates the continued development of more aggressive thermal management techniques using, for instance, liquid-cooling. Various types of liquid coolants and liquid-cooling approaches are known, and provide different cooling capabilities. For instance, fluids such as refrigerants or other dielectric liquids (e.g., fluorocarbon liquids) exhibit lower thermal conductivity and specific heat properties, compared to liquids such as water or other aqueous fluids, but can be placed in direct physical contact with electronic components and their associated interconnects without adverse effects, such as corrosion or electrical short circuits. Other coolant liquids, such as water or other aqueous fluids, exhibit superior thermal conductivity and specific heat compared to dielectric fluids. However, water-based coolants must be separated from physical contact with the electronic components and interconnects, since corrosion and electrical short circuit problems are otherwise likely to result. This is typically accomplished by flowing the liquid coolant through a liquid-cooled heat sink or cold plate.

SUMMARY

Certain shortcomings of the prior art are overcome, and additional advantages are provided through the provision of a method of providing a coolant-cooled heat sink with a coolant-carrying compartment between a cover and a heat transfer base. The heat transfer base includes a heat transfer surface to couple to a component to be cooled, and the heat transfer base has a plurality of thermally-conductive fins extending into the coolant-carrying compartment from a surface of the heat transfer base opposite to the heat transfer surface. The method includes: providing at least one groove in a surface defining, in part, an interface of the cover and the plurality of thermally-conductive fins, and providing at least one wicking element within, at least in part, the at least one groove. The method also includes providing a joining material between the cover and the plurality of thermally-conductive fins in contact with the at least one wicking element, and joining the plurality of thermally-conductive fins to the cover at the interface using the joining material. During the joining, the at least one wicking element within, at least in part, the at least one groove in the surface at the interface of the cover and the plurality of thermally-conductive fins facilitates retaining the joining material over the plurality of thermally-conductive fins.

In another aspect, an apparatus is provided which includes a coolant-cooled heat sink with a coolant-carrying compartment. The coolant-cooled heat sink includes a heat transfer base with a heat transfer surface to couple to a component to be cooled. The heat transfer base further includes a plurality of thermally-conductive fins extending into the coolant-carrying compartment from a surface of the heat transfer base opposite to the heat transfer surface. A cover is sealed to the heat transfer base, and the heat transfer base and cover define, at least in part, the coolant-carrying compartment therebetween. At least one wicking element is disposed in at least one groove in a surface at the interface of the cover and the plurality of thermally-conductive fins, which overlies, at least in part, the plurality of thermally-conductive fins, and a joining material contacts the at least one wicking element and resides, at least in part, within the at least one groove. The joining material joins the plurality of thermally-conductive fins to the cover.

In a further aspect, an apparatus is provided which includes a heat-generating electronic component, and a coolant-cooled heat sink. The coolant-cooled heat sink includes a heat transfer base with a heat transfer surface coupled to the heat-generating electronic component. The heat transfer base further includes a plurality of thermally-conductive fins extending into a coolant-carrying compartment of the coolant-cooled heat sink from a surface of the heat transfer base opposite to the heat transfer surface. A cover is sealed to the heat transfer base, and the heat transfer base and cover define, at least in part, the coolant-carrying compartment therebetween. At least one wicking element is disposed in at least one groove in a surface at an interface of the cover and the plurality of thermally-conductive fins, where the at least one groove overlies, at least in part, the plurality of thermally-conductive fins. A joining material contacts the at least one wicking element and resides, at least in part, within the at least one groove. The joining material joins the plurality of thermally-conductive fins to the cover.

Additional features and advantages are realized through the techniques of the present invention. Other embodiments and aspects of the invention are described in detail herein and are considered a part of the claimed invention.

BRIEF DESCRIPTION OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

DETAILED DESCRIPTION

Figure 1:
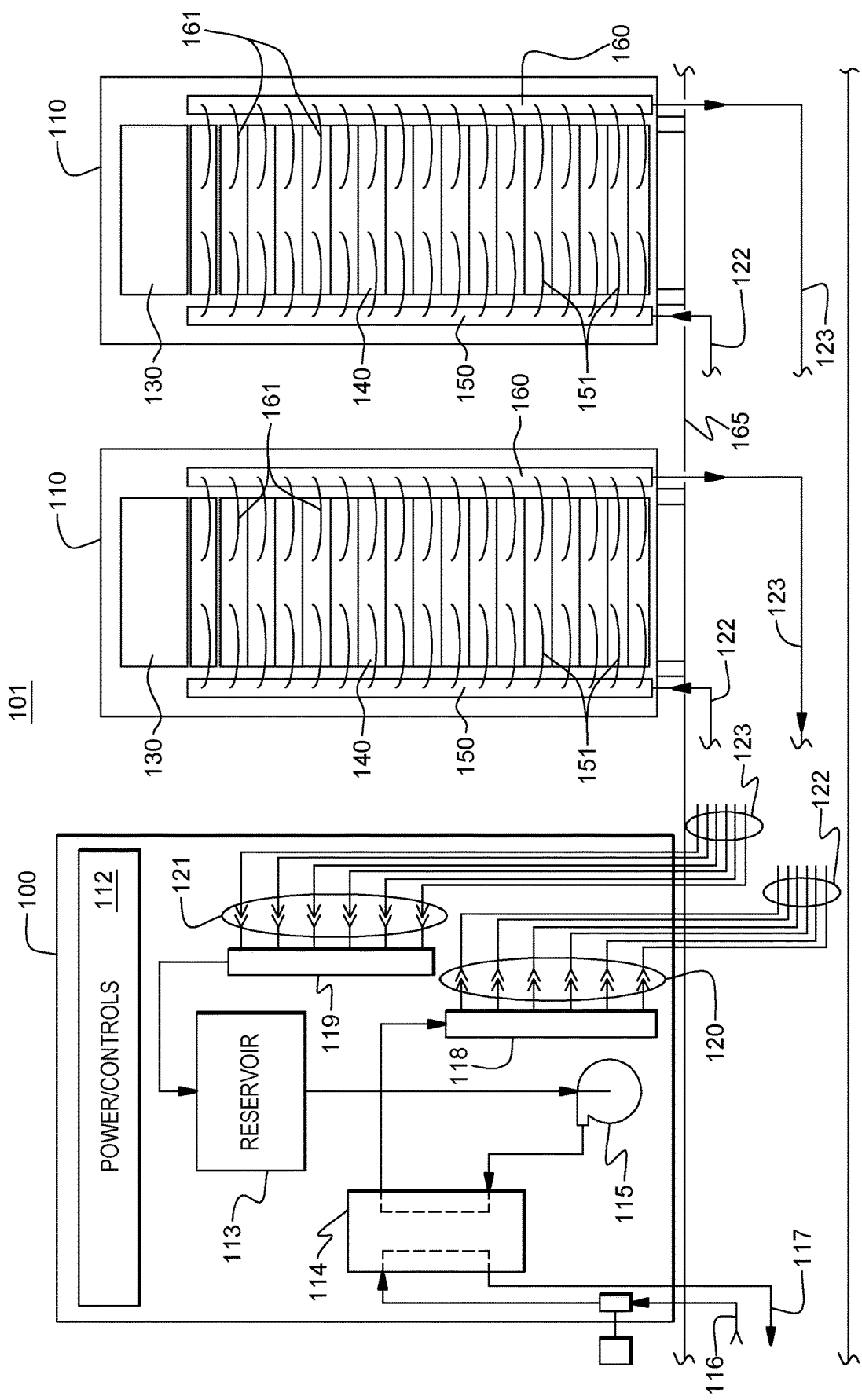
FIG. 1 depicts one embodiment of a coolant-cooled data center with a coolant distribution unit facilitating liquid-cooling of electronic systems within racks of the data center, in accordance with one or more aspects of the present invention.

Aspects of the present invention and certain features, advantages and details thereof, are explained more fully below with reference to the non-limiting example(s) illustrated in the accompanying drawings. Descriptions of well-known materials, systems, devices, fabricating techniques, processes, etc., are omitted so as to not unnecessarily obscure the invention in detail. It should be understood, however, that the detailed description and this specific example(s), while indicating aspects of the invention, are given by way of illustration only, and not by way of limitation. Various substitutions, modifications, additions, and/or other arrangements, within the spirit and/or scope of the underlying inventive concepts will be apparent to those skilled in the art from this disclosure. Note further that numerous inventive aspects and features are disclosed herein, and unless inconsistent, each disclosed aspect or feature is combinable with any other disclosed aspect or feature as desired for a particular application of a coolant-cooled heat sink with internal thermally-conductive fins joined to the heat sink cover, as disclosed herein.

As is known, an electronics rack, or IT rack, includes any housing, frame, rack, compartment, blade server system, etc., having one or more heat-generating components of a computer system, electronic system, information technology equipment, etc. In one or more embodiments, an electronics rack can include a portion of an electronic system, a single electronic system, or multiple electronic systems, for instance, in one or more sub-housings, blades, books, drawers, nodes, compartments, etc., each having one or more heat-generating electronic components disposed therein. An electronic system within an electronics rack can be movable or fixed relative to the electronics rack, with rack-mounted electronic drawers being an example of systems of an electronics rack to be cooled.

An electronic component refers to any heat-generating electronics component of, for instance, a computer system or other electronics unit requiring cooling. By way of example, an electronic component can include one or more integrated circuit die (or chips), and/or other electronic devices to be cooled, including one or more processor chips, such as central processing unit (CPU) chips and/or graphics processing unit (GPU) devices. Further, the term coolant-cooled heat sink or cold plate refers to a thermally-conductive structure or assembly having one or more internal compartments, channels, passageways, etc., formed therein for flowing of coolant therethrough.

One example of coolant to be used within a coolant-cooled heat sink discussed herein is water. However, the cooling concepts disclosed herein are readily adapted to use with other types of coolant.

As noted, due to the ever-increasing airflow requirements through electronics racks of a data center, and the limits of air distribution within a typical data center installation, it can be desirable for liquid-based cooling to, for instance, be combined with, or used in place of, conventional air-cooling. By way of example only, FIGS. 1-3 illustrate one embodiment of a data center and electronics system employing a liquid-based cooling system or cooling assembly with one or more coolant-cooled heat sinks or cold plates coupled to high-heat-generating electronic components disposed within one or more electronic systems of one or more electronics racks.

In particular, FIG. 1 depicts one embodiment of a data center 101 including a coolant distribution unit 100. The coolant distribution unit can be a relatively large unit which occupies what would be considered a full electronics frame. Within coolant distribution unit 100 is a power/control element 112, a reservoir/expansion tank 113, a heat exchanger 114, a pump 115 (possibly accompanied by a redundant second pump), facility water inlet 116 and outlet 117 supply pipes, a supply manifold 118 supplying water or system coolant to the electronics racks 110 via couplings 120 and lines 122, and a return manifold 119 receiving water from the electronics racks 110, via lines 123 and couplings 121. Each electronics rack includes (in one example) a power/control unit 130 for the electronics rack, multiple electronic systems 140, a system coolant supply manifold 150, and a system coolant return manifold 160. By way of example only, electronics rack 110 are disposed on a raised floor 165 of data center 101, with lines 122 providing system coolant to system coolant supply manifolds 150 and lines 123 facilitating return of system coolant from system coolant return manifolds 160 being disposed beneath the raised floor.

In one embodiment, system coolant supply manifold 150 provides system coolant to the cooling assemblies of the electronic systems (including to coolant-cooled heat sinks thereof) via flexible hose connections 151, which are disposed between the supply manifold and the respective electronic systems within the rack. Similarly, system coolant return manifold 160 is coupled to the electronic systems via flexible hose connections 161. Quick connect couplings can be employed at the interface between flexible hoses 151, 161 and the individual electronic systems.

Figure 2A:
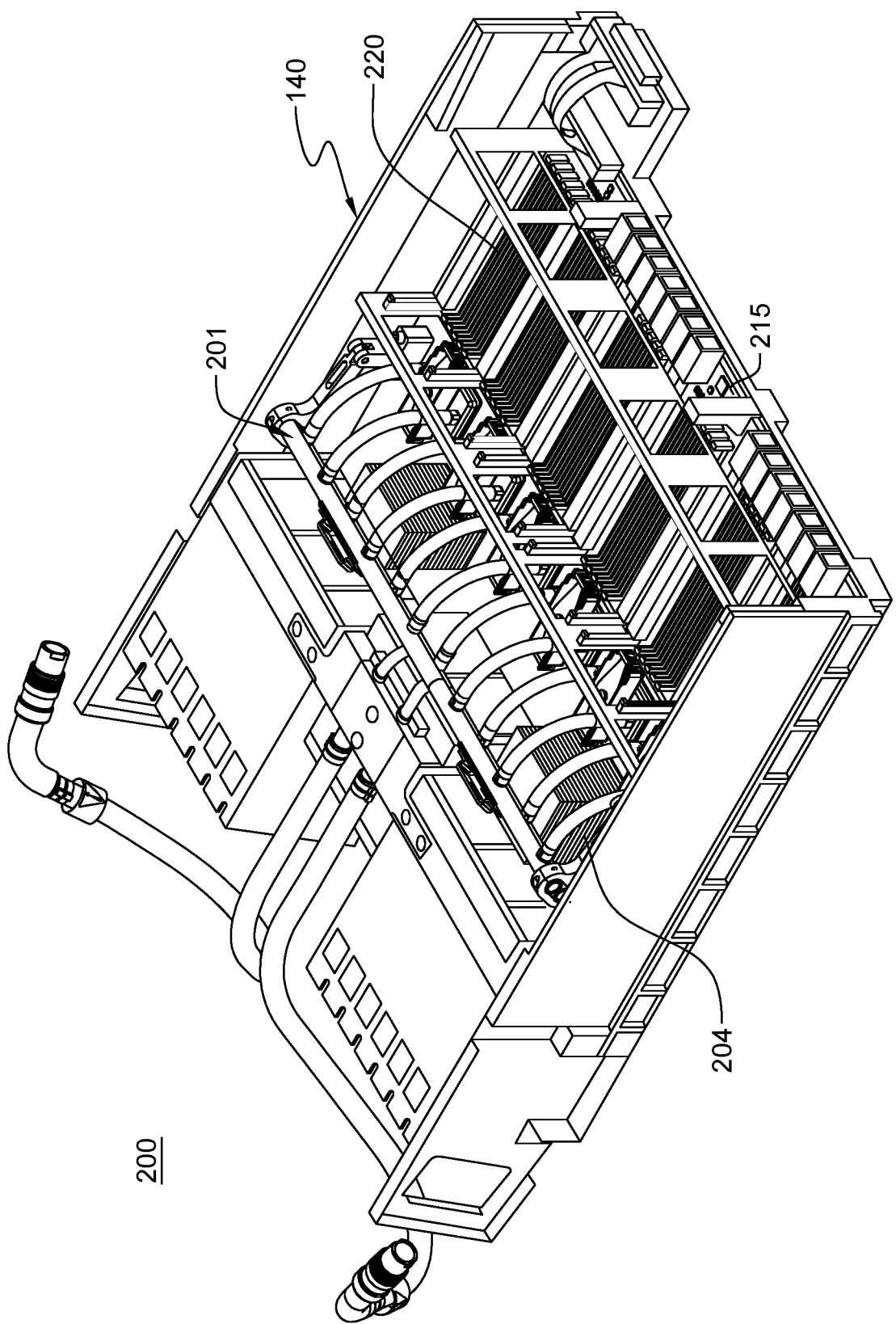
FIG. 2A depicts one embodiment of a partially assembled electronic system and cooling assembly layout, wherein the electronic system includes, by way of example, six heat-generating electronic components to be actively cooled by the cooling assembly, in accordance with one or more aspects of the present invention.
Figure 2B:
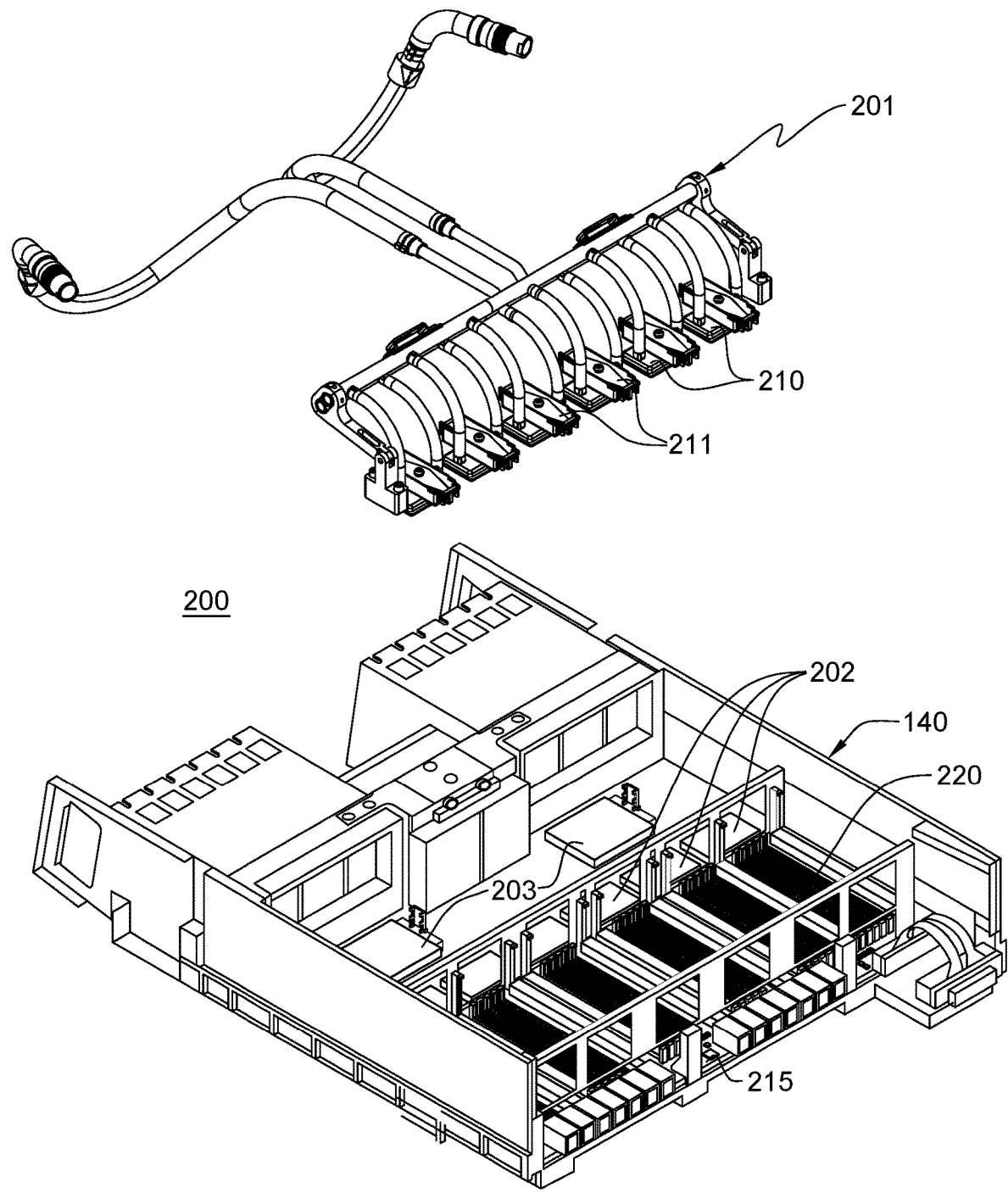
FIG. 2B depicts the electronic system and cooling assembly layout of FIG. 2A, with the cooling assembly shown exploded from the electronic system, in accordance with one or more aspects of the present invention.
Figure 3:
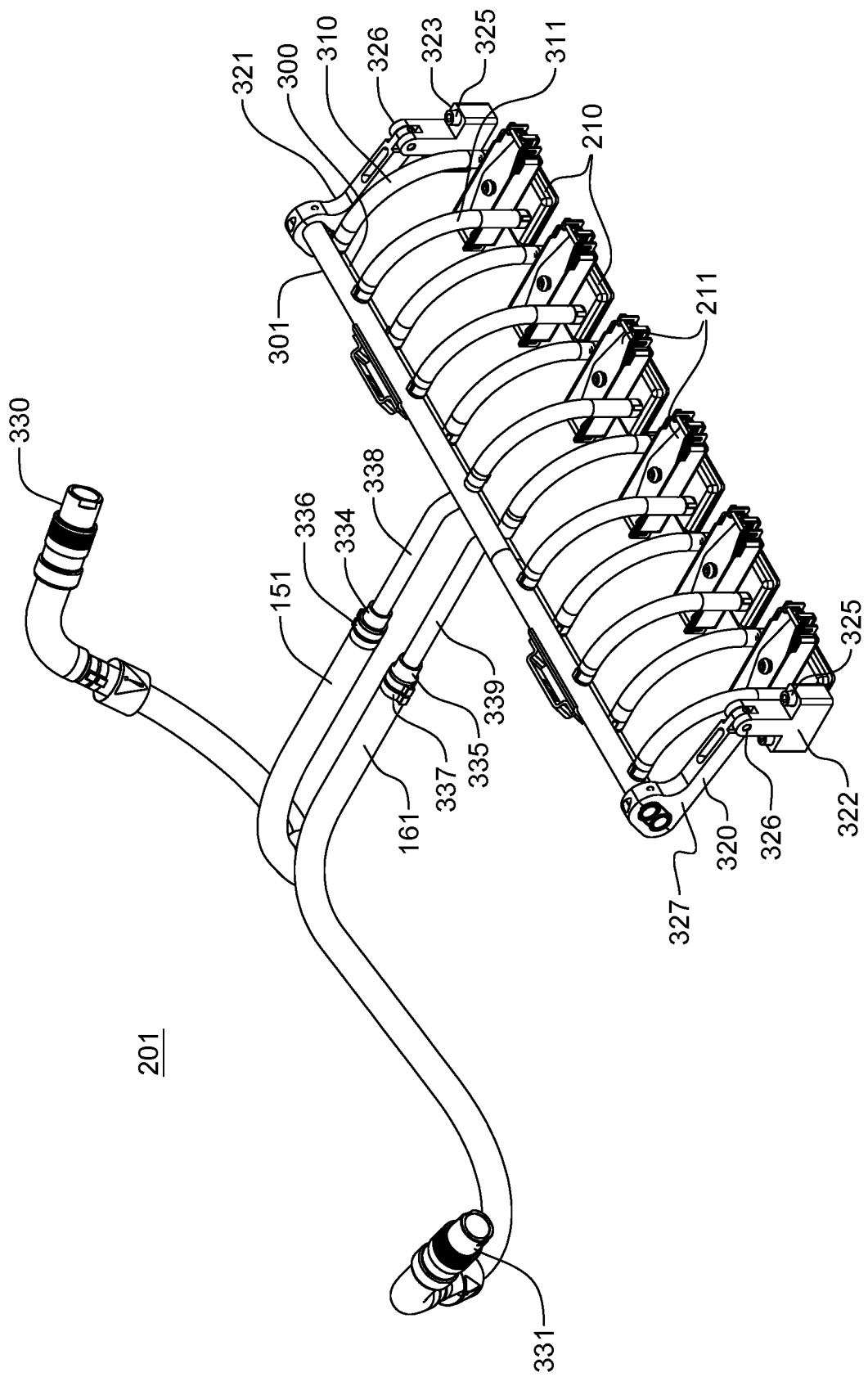
FIG. 3 is an enlarged view of the cooling assembly of FIGS. 2A & 2B, in accordance with one or more aspects of the present invention.

FIGS. 2A & 2B depict one embodiment of a cooled electronic system 200, in accordance with one or more aspects of the present invention. By way of example, cooled electronic system 200 includes electronic system 140, such as the above-described drawer- or node-level electronic system of FIG. 1, and a flexible coolant manifold-heat sink assembly 201 coupled thereto, in accordance with one or more aspects of the present invention. In this implementation, flexible coolant manifold-heat sink assembly 201 is a drawer- or node-level cooling assembly with multiple coolant-cooled heat sinks 210, each configured and sized to attach to and cool a respective electronic component 202, such as a respective high-heat-generating electronic component of a server node. In one example, respective loading brackets 211 can be provided to facilitate secure attachment and loading of coolant-cooled heat sinks 210 to electronic components 202 to ensure good thermal conduction from electronic components 202 to coolant-cooled heat sinks 210.

As one detailed example, the exemplary electronic system of FIGS. 2A & 2B can be an electronics drawer or planar server assembly, which includes a multilayer printed circuit board to which memory sockets and various electronic components to be cooled are attached, both physically and electrically. As illustrated, electronic system 140 can include a support substrate or planar board 215, a plurality of memory module sockets 220 (e.g., dual in-line memory module sockets), as well as high-heat-generating processor modules 202, and other components 203, such as memory support modules, which produce less heat and can be air-cooled.

By way of example only, in one or more implementations, one or more other components 203 of electronic system 140 can be air-cooled by an airflow established using one or more air-moving devices (not shown) within electronic system 140, or the electronics rack housing the system. As illustrated, the one or more other components 203 to be air-cooled may have one or more air-cooled heat sinks 204 (FIG. 2A) physically coupled thereto. Note that in the particular embodiment depicted, flexible coolant manifold-heat sink assembly 201 includes a pivotable coolant supply manifold and pivotable coolant return manifold disposed in a first, operational position in FIG. 2A, laterally offset from the row of coolant-cooled heat sinks 210, but overlying the one or more other components 203 of electronic system 140, such as one or more single-chip modules to which air-cooled heat sinks 204 are coupled.

FIG. 3 depicts an enlarged view of one embodiment of flexible coolant manifold-heat sink assembly 201. Note that this implementation of cooling assembly 201 is a drawer- or node-level implementation designed to reside within an electronic system chassis of, for instance, one or more electronic system chassis within an electronics rack, and is discussed herein by way of example only. As illustrated, in addition to multiple coolant-cooled heat sinks 210, flexible coolant manifold-heat sink assembly 201 includes a pivotable coolant supply manifold 300 and a pivotable coolant return manifold 301, which are coupled in this embodiment at opposite ends to a first pivot arm 320 and a second pivot arm 321. Flexible coolant supply conduits 310 and flexible coolant return conduits 311 couple, in the illustrated example, each coolant-cooled heat sink 210 in fluid communication with pivotable coolant supply manifold 300 and pivotable coolant return manifold 301 to allow for flow of coolant, such as liquid coolant, through the heat sinks to facilitate extraction of heat generated by the associated electronic components to which the heat sinks are coupled. Note that, by way of example, each coolant-cooled heat sink 210 has a flexible coolant supply conduit 310 and a flexible coolant return conduit 311 coupled thereto for direct supply and return of coolant through the coolant-cooled heat sink. Thus, in the illustrated embodiment, coolant, such as liquid coolant, flows in parallel through the heat sinks between the pivotable coolant supply manifold 300 and pivotable coolant return manifold 301.

As noted, respective loading brackets 211 can be provided to facilitate (in part) a good thermal interface and good thermal conduction between coolant-cooled heat sinks 210 and the associated electronic components 202 (FIG. 2B) to be cooled. Flexible coolant supply conduits 310 and flexible coolant return conduits 311 are, in one embodiment, fabricated of a flexible, insulative material, such as rubber, and are of sufficient length to couple rigid coolant-cooled heat sinks 210 to pivotable coolant supply manifold 300 and pivotable coolant return manifold 301, via appropriate hose barb fittings and hose clamps. Note that the length of each coolant supply conduit 310 and coolant return conduit 311 is also sufficient to allow for pivotable movement of the rigid pivotable coolant supply manifold 300 and rigid pivotable coolant return manifold 301 between a first position, illustrated in FIG. 3, and a second service position, not illustrated. Note in this regard that the first and second pivot arms 320, 321 include respective base members for 322, 323 which facilitate fastening of the first and second pivot arms to, for instance, a structure associated with the electronic system including the electronic components to be cooled. For instance, the first and second pivot arms 320, 321 could be affixed using mechanical fasteners 325 to the support substrate or planar system board in the example of FIGS. 2A & 2B. Note also, in the example depicted in FIG. 3, first and second pivot arms 320, 321 align with the row of coolant-cooled heat sinks 210, and include a pivot axis 326 at upper ends of base members 322, 323, about which pivot elements 327 of the first and second pivot arms 320, 321, pivot. In the example depicted, the pivot axis 326 is at an elevated height above the row of coolant-cooled heat sinks 210, and pivotable coolant supply manifold 300 and pivotable coolant return manifold 301 are at an elevation higher than the coolant-cooled heat sinks when installed within the associated electronic system.

Flexibility is further achieved in the cooling assembly disclosed using flexible manifold-to-node fluid connect hoses 151, 161 to connect flexible coolant manifold-heat sink assembly 201 to, for instance, rack-level coolant supply and return manifolds, respectively (see FIGS. 1-2B). In one or more implementations, respective quick connect couplings 330, 331 at the ends of flexible manifold-to-node fluid connect hoses 151, 161, can be provided, and rigid tube extensions 338, 339 can respectively extend from pivotable coolant supply manifold 300 and pivotable coolant return manifold 301 and facilitate coupling of flexible manifold-to-node fluid connect hoses 151, 161 to the corresponding pivotable coolant supply and return manifolds using, for instance, respective hose barb fittings 334, 335 and hose clamps 336, 337. Note that, in one implementation, pivoting of pivotable coolant supply and return manifolds 300, 301 can be facilitated by providing flexible manifold-to-node fluid connect hoses 151,161 with sufficient length to allow for transition of the pivotable coolant supply and return manifolds 300, 301 between their respective first and second positions, as described. Alternatively, the respective quick connect couplings 330, 331 with poppets can be disengaged from, for instance, the rack-level coolant supply and return manifolds (FIG. 1) prior to pivoting of the pivotable coolant supply and return manifolds 300, 301 from the illustrated first position to their second position.

By way of example, and as illustrated in FIGS. 2A & 3, pivotable coolant supply and return manifolds 300, 301 can be in a first position to, for instance, facilitate inclusion of the cooling assembly within the electronic system housing, drawer, chassis, etc., and operational insertion of the resultant cooled electronic system within the respective electronics rack. From this position, flexible coolant supply and return conduits 310, 311, and (in one or more embodiments) flexible manifold-to-node fluid connect hoses 151, 161 allow for pivoting of pivotable coolant supply and return manifolds 300, 301 to a second position, such as for servicing. Note that the in-line, six electronic component and six coolant-cooled heat sink example of FIGS. 2A-3 is provided as one example only of a coolant-based cooling system with coolant-cooled heat sinks, such as disclosed herein. In general, the coolant-cooled heat sinks disclosed herein can be used in a wide variety of coolant-based cooling systems to facilitate active cooling of one or more heat-generating components, such as one or more heat-generating electronic components of an electronic system, such as described above in connection with FIGS. 1-3, by way of example only.

In one or more embodiments, the coolant-cooled heat sink(s) of a cooling system can be partially or completely formed of a thermally-conductive metal material, such as copper or a copper alloy. Further, in one or more implementations, high-heat flux removal is facilitated by forming an array of thermally-conductive fins, such as an array of finely spaced, copper fins, extending interior to a coolant-carrying compartment of a closed coolant loop heat sink structure. In one embodiment, high-temperature brazing processes can be used to form hermetic (coolant-tight) seals between the cover plate, thermally-conductive fins, heat transfer base plate and hose barb connections. As fin pitch decreases, control of brazed flow material over the fins is advantageous in order to maximize efficiency of the cooling fin structure of the heat sink. For instance, as fin pitch decreases, strong capillary forces can cause liquid (e.g., melted) joining material to migrate into gap spaces between adjacent thermally-conductive fins, blocking, at least in part, the gaps, reducing coolant flow rate through the heat sink, and degrading thermal performance of the heat sink. Thus, enhanced control of the joining material over the fins during fabrication of the coolant-cooled heat sink is disclosed herein to advantageously maximize thermal performance of the heat sink in use.

Disclosed herein, in one or more embodiments, is the inclusion of one or more wicking elements and grooves at the interface of the cover and the plurality of thermally-conductive fins extending from the heat transfer base. In one or more embodiments, the wicking element(s) resides in one or more respective grooves in a surface at the interface of the cover and the fins which accommodate (at least in part) the wicking element(s) and the joining material and provide additional surface area at the interface to retain the joining material over the plurality of thermally-conductive fins. In one or more embodiments, the one or more grooves overlie, at least in part, the plurality of thermally-conductive fins. For instance, the one or more grooves extend across the plurality of thermally-conductive fins. Further, in one or more embodiments, grooves are provided in either, or both, the inner surface of the cover and the upper surface of the fins.

In one or more implementations, the one or more wicking elements are positioned within, at least in part, the one or more grooves in the surface defining, in part, the interface of the cover and the plurality of thermally-conductive fins. In one embodiment, the wicking element(s) are formed of a material selected/designed to wet/react with the joining materials (e.g., braze materials) after the materials melt as part of the joining process. The bonding of the joining material to the wicking element(s), and the flow of the material along the wicking element(s), advantageously reduces the total surface energy of the joining material, and inhibits or even prevents joining material from migrating into the underlying gaps between adjacent thermally-conductive fins. Advantageously, adding one or more wicking elements, such as disclosed in exemplary embodiments herein, over the thermally-conductive fins also facilitates increasing mechanical rigidity of the coolant-cooled heat sink by, for instance, dispersing the melted joining material more evenly across the interface between the thermally-conductive fins and cover.

In one or more embodiments, the wicking element(s) direct the joining material laterally above and across the thermally-conductive fins, further mitigating or eliminating fin clogging during the joining process, which is particularly advantageous as pitch between thermally-conductive fins continues to decrease. The structural support provided by the wicking element(s) and joining material also increases strength of the fin structures, and prevents fin-bending and/or buckling by distributing forces across the top of the thermally-conductive fins during the joining process.

In general, disclosed herein, in one or more aspects, are methods of fabricating coolant-cooled heat sinks with an internal coolant-carrying compartment between a cover and a heat transfer base. The heat transfer base includes a heat transfer surface to couple to a component to be cooled, and a plurality of thermally-conductive fins extending into the coolant-carrying compartment from a surface of the heat transfer base opposite to the heat transfer surface. Fabricating the coolant-cooled heat sink includes providing at least one groove in a surface defining, in part, an interface of the cover and the plurality of thermally-conductive fins, and providing at least one wicking element within, at least in part, the at least one groove. Further, the fabricating includes providing a joining material between the cover and the plurality of thermally-conductive fins in contact within the at least one wicking element. The method further including joining the plurality of thermally-conductive fins to the cover at the interface using the joining material. The at least one wicking element within, at least in part, the at least one groove in the surface at the interface of the cover and the plurality of thermally-conductive fins facilitates retaining the joining material over the plurality of thermally-conductive fins during the joining.

In one or more embodiments, the joining includes applying heat to melt the joining material, with the melted joining material wetting the at least one wicking element and migrating, at least in part, along the at least wicking element within the at least one groove in the surface. Advantageously, wetting the wicking element(s) with the melted joining material distributes the melted joining material, at least in part, across the interface between the cover and fins during the joining process, potentially increasing mechanical strength and rigidity of the resultant assembly. Further, the melted joining material migrating, at least in part, along the wicking element(s), reduces the total surface energy of the melted joining material over the plurality of thermally-conductive fins, thereby inhibiting the melted joining material from migrating into the gaps between the thermally-conductive fins, and preventing the melted joining material from clogging the gaps between thermally-conductive fins.

In one or more embodiments, the wicking element(s) is one or more metal wires, and the joining material is a brazing material. Advantageously, the same brazing facilitates and materials as currently practiced in forming coolant-cooled heat sinks can be used, including the same braze furnaces and alloys, without significant change. The addition of the groove(s), as well as the addition of the wicking element(s), and the operation of the groove(s) and/or wicking element(s) during the fabrication process, as well as the restricting of the joining material to contact with the wicking element(s), results in minimal impact on the brazing process, or profile, as currently practiced, including temperature, furnace atmosphere control, etc. In one or more implementations, the at least one groove is sized to accommodate therein, in part, the melted joining material (e.g., melted braze or solder). Further, in one or more implementations with wicking elements, one or more braided, metal wires can be used, where the braiding facilitates the wicking and retaining of the joining material over the plurality of thermally-conductive fins during the joining process.

In one or more implementations, providing the groove(s) in the surface defining, in part, the interface between the cover and the plurality of thermally-conductive fins includes providing the at least one groove in an upper surface of the plurality of thermally-conductive fins. In one embodiment, providing the at least one groove in the upper surface of the plurality of thermally-conductive fins includes providing the at least one groove to extend across the upper surface of the plurality of thermally-conductive fins. Further, in one or more embodiments, fabricating the coolant-cooled heat sink further includes providing at least one groove in an inner surface of the cover to overlie the plurality of thermally-conductive fins when the cover is operatively coupled to the heat transfer base. In these implementations, a groove of the at least one groove in the upper surface of the plurality of thermally-conductive fins aligns with a groove of the at least one groove in the inner surface of the cover, and a wicking element of least one wicking element can reside in part within the groove in the upper surface of the plurality of thermally-conductive fins, and in part in the groove in the inner surface of the cover with joining of the plurality of thermally-conductive fins and the cover. In one implementation, the groove in the upper surface of the plurality of thermally-conductive fins, and the groove in the inner surface of the cover, are configured and sized such that a greater portion of the wicking element resides within the groove in the inner surface of the cover than within the groove in the upper surface of the plurality of thermally-conductive fins.

In one or more implementations, providing the groove(s) in the surface defining, in part, the interface between the cover and the plurality of thermally-conductive fins includes providing the at least one groove in an upper surface of the plurality of thermally-conductive fins. In one embodiment, providing the at least one groove in the upper surface of the plurality of thermally-conductive fins includes providing the at least one groove to extend across the upper surface of the plurality of thermally-conductive fins.

In one or more embodiments, the method includes providing multiple grooves in the surface defining, in part, the interface of the cover and the thermally-conductive fins, with the at least one groove being at least one groove of the multiple grooves, and providing multiple wicking elements, each wicking element residing, at least in part, within a respective groove of the multiple grooves. The multiple wicking elements reside, in part, within the multiple grooves in the surface at the interface of the cover and the plurality of thermally-conductive fins to facilitate wicking and retaining the joining material over the plurality of the thermally-conductive fins during the joining process. Further, in one or more embodiments, the surface defining, in part, the interface between the cover and the plurality of thermally-conductive fins is an inner surface of the cover, and the method further includes providing multiple grooves in an upper surface of the plurality of thermally-conductive fins at the interface between the cover and the plurality of thermally-conductive fins such that a groove of the multiple grooves in the upper surface of the plurality of thermally-conductive fins aligns with a groove of the multiple grooves in the inner surface of the cover. Further, a wicking element of the multiple wicking elements resides, in part, within a respective groove of the multiple grooves in the upper surface of the plurality of thermally-conductive fins so that the wicking element is retained in position between the cover and the plurality of thermally-conductive fins during the joining process.

By way of example, the plurality of thermally-conductive fins within the heat sink can include a plurality of parallel-disposed, thermally-conductive plate fins, which define channels or gaps between the fins, into which coolant is introduced and flows, for example, from an inlet side of the coolant-cooled heat sink to an outlet side of the coolant-cooled heat sink, in a direction substantially parallel to the main heat transfer surface of the heat transfer base. Those skilled in the art should note, however, that the concepts disclosed herein can be used in association with differently configured thermally-conductive fins extending into the thermally-conductive channel from the heat transfer base. For instance, in one or more other embodiments, the thermally-conductive fins can include a plurality of thermally-conductive pin fins extending into the coolant-carrying compartment from the surface of the heat transfer base opposite to the heat transfer surface.

Multiple embodiments of coolant-cooled heat sinks in accordance with one or more aspects of the present invention are described hereinbelow with reference to FIGS. 4A-9. As noted, in one or more implementations, the coolant-cooled heat sink includes one or more wicking elements disposed in one or more groves in a surface defining, in part, an interface of the cover and the plurality of thermally-conductive fins.

By way of example, FIGS. 4A-4D depict one embodiment of an apparatus 400, in accordance with one or more aspects of the present invention. As illustrated, in this embodiment, apparatus 400 includes one or more electronic components 401 (FIG. 4A) and a coolant-cooled heat sink 410 (shown in exploded view in FIG. 4A). The one or more electronic components 401 can be disposed, for instance, on a supporting substrate 402, which can facilitate electrical connection of the electronic component(s) to other component(s) of an electronic system, such as described above.

Figure 4A:
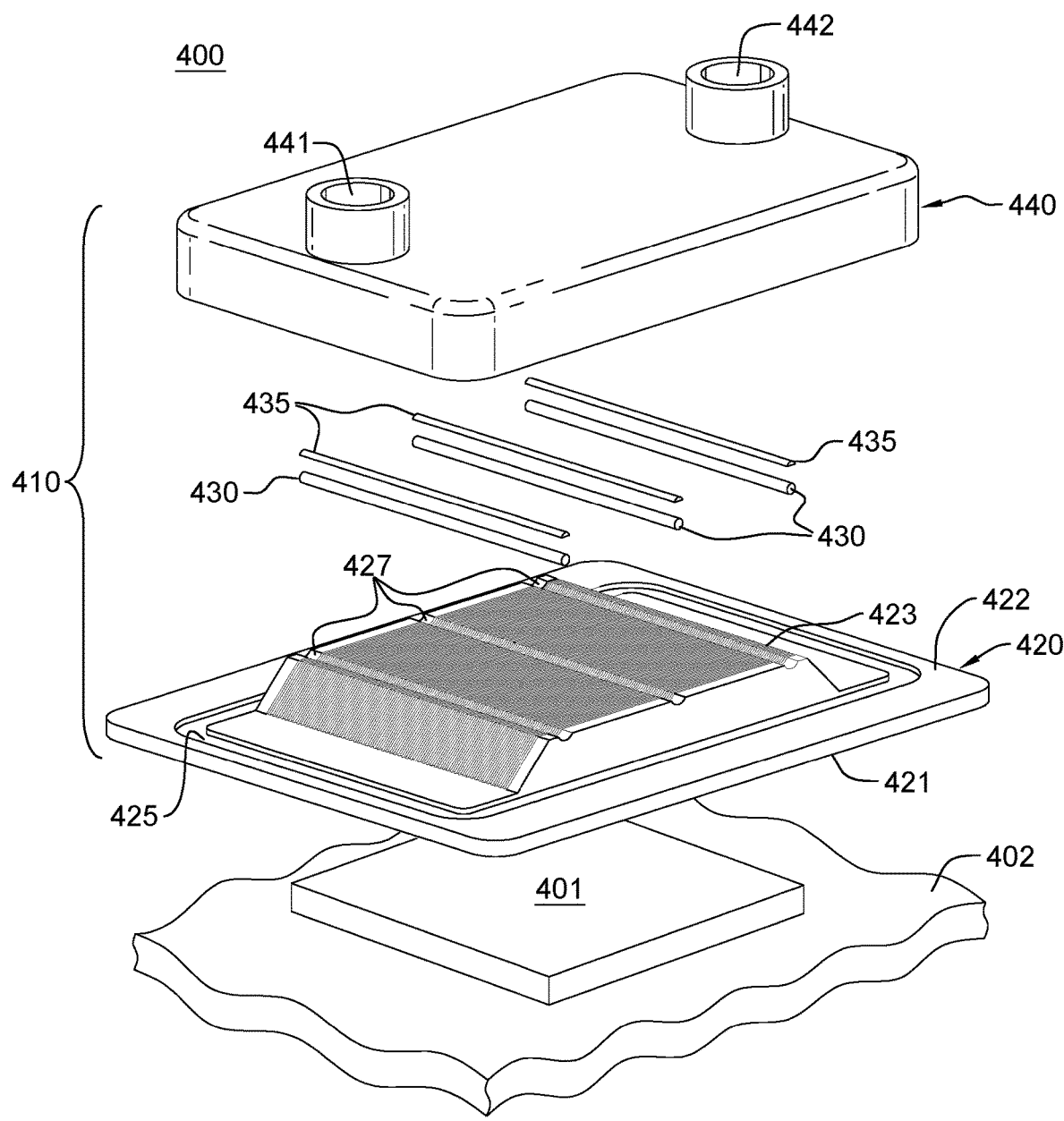
FIG. 4A depicts an exploded view of one embodiment an apparatus including one or more electronic components to be cooled, and a coolant-cooled heat sink for a cooling assembly, such as (for instance) the cooling assembly embodiment of FIGS. 1-3, in accordance with one or more aspects of the present invention.

Referring to FIG. 4A, coolant-cooled heat sink 410 includes, for instance, a heat transfer base 420, one or more wicking elements 430, a joining material 435, and a cover 440. In the depicted embodiment, heat transfer base 420, which is an active cooling portion, or heat transfer portion, of the coolant-cooled heat sink, is rectangular-shaped, by way of example only. In one or more embodiments, heat transfer base 420 is thermally-conductive, being fabricated of a good thermal conductor, such as a metal, for instance, copper or a metal alloy, such as a copper alloy. Heat transfer base 420 includes a heat transfer surface 421, sized and configured to couple to electronic component(s) 401 to be cooled. By way of example, heat transfer surface 421 can be a flat, lower surface of heat transfer base 420, which is appropriately sized to couple and substantially cover the electronic component(s) to be cooled. A plurality of thermally-conductive fins 423 extend, in one or more embodiments, from a surface 422 of heat transfer base 420 opposite to heat transfer surface 421. In the depicted embodiment, the plurality of thermally-conductive fins 423 are a plurality of thermally-conductive plate fins oriented substantially parallel, with channels defined between adjacent thermally-conductive plate fins. As noted, the concepts disclosed herein can be used in association with other thermally-conductive fin configurations, as well.

In the embodiment depicted, three grooves 427 in the upper surface of thermally-conductive fins 423 and three wicking elements 430 are shown by example only, each sized to extend across the width of the plurality of thermally-conductive fins 423 within the heat sink. In one or more implementations, each wicking element(s) is positioned in a respective groove in the upper surface of the plurality of thermally-conductive fins 423 and/or in a respective groove in the inner surface of cover 440, as explained further herein. In this manner, wicking element(s) 430 are disposed over the plurality of thermally-conductive fins of heat transfer base 420, between the plurality of thermally-conductive fins 423 and cover 440. In one or more embodiments, joining material 435, such as a braze or solder material, is configured to contact the wicking element(s) 430, and can originally be disposed between each wicking element(s) 430 and cover 440, as shown in FIG. 4A. Note that joining material 435 and/or joining material 435' (of FIGS. 4B-4D) refers to any material to facilitate joining, and/or a joint formed between the plurality of thermally-conductive fins 423, wicking element(s) 430, and/or cover 440, such as during brazing, soldering, metal-metal diffusion bonding, resistance welding (RF), laser sealing and/or welding, etc. Note also that three sets of grooves and three wicking elements are depicted by way of example only. In one or more other implementations, one, two, or four or more grooves and/or wicking elements could be provided across the plurality of thermally-conductive fins. Further, the shape of each groove and/or each wicking element can vary, as can the dimensions, if desired for a particular configuration. During fabrication, a same or different joining material (e.g., braze material) can also be provided within a circumferential groove 425 formed in surface 422, sized and configured to receive an edge of cover 440 to facilitate hermetically sealing cover 440 to heat transfer base 420. In one or more embodiments, wicking element(s) 430 can be fabricated of a metal or, for instance, a metal alloy, with a higher melting point than the joining material 435. By way of example, wicking element 430 can be formed of copper or nickel, or a copper or nickel alloy.

Figure 4B:
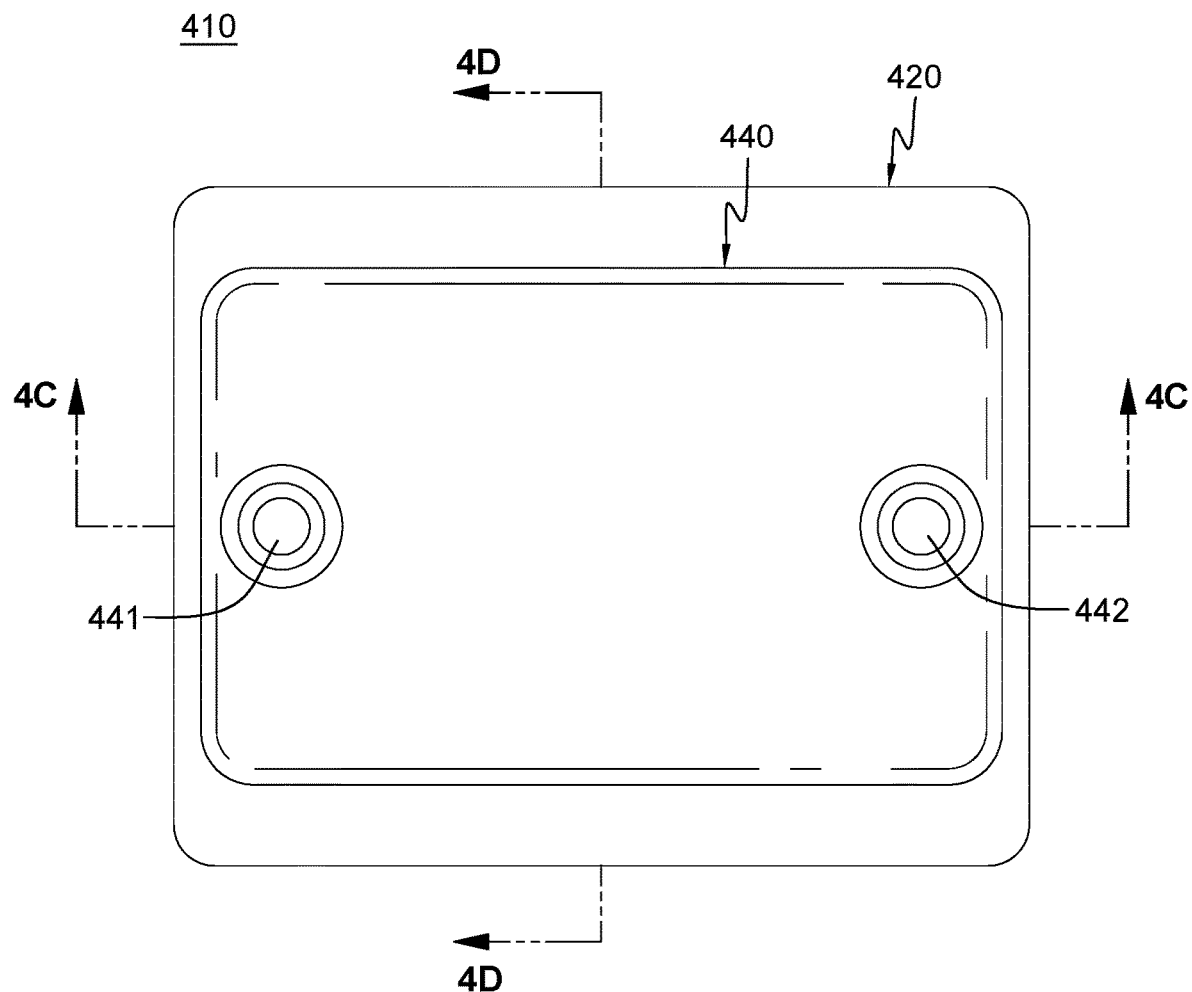
FIG. 4B is a plan view of the coolant-cooled heat sink of FIG. 4A, in accordance with one or more aspects of the present invention.
Figure 4C:
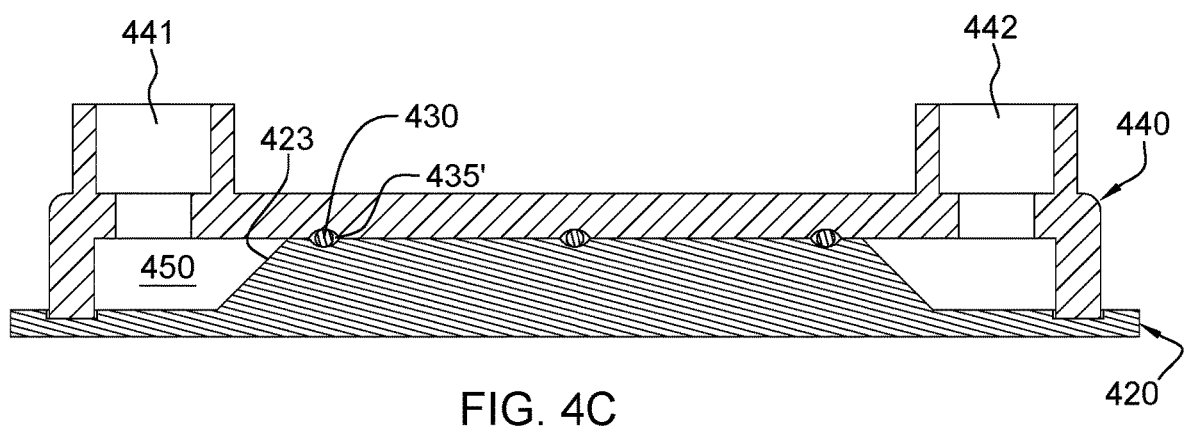
FIG. 4C is a cross-sectional elevational view of the coolant-cooled heat sink of FIG. 4B, taken along line 4C-4C thereof, in accordance with one or more aspects of the present invention.
Figure 4D:
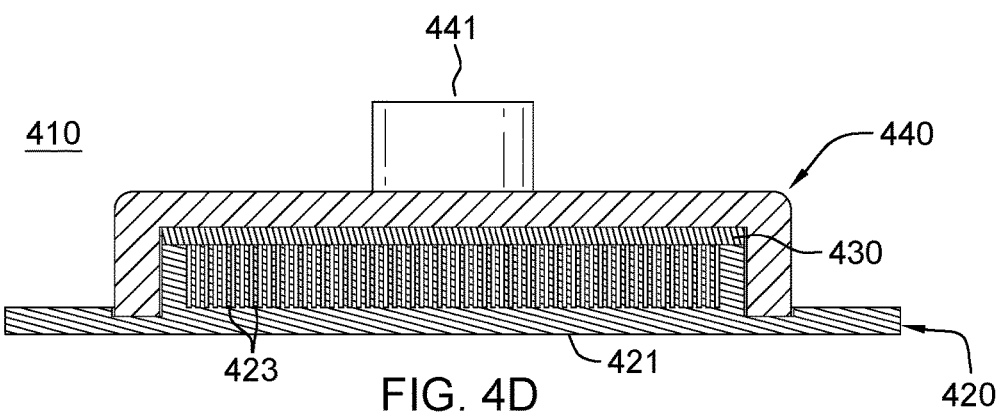
FIG. 4D is a cross-sectional elevational view of the coolant-cooled heat sink of FIG. 4B, taken along line 4D-4D thereof, in accordance with one or more aspects of the present invention.

FIGS. 4B-4D depict coolant-cooled cold plate 410 after assembly and sealing of cover 440 to heat transfer base 420. Referring collectively to FIGS. 4B-4D, cover 440 and heat transfer base 420 are configured to define an internal coolant-carrying compartment 450 between the cover and base with sealing of the cover to the base using, for instance, a joining material, as described herein. In one or more embodiments, as part of the sealing process, the coolant-cooled heat sink assembly is heated in order to melt the joining material(s), including the joining material disposed between fins 423, wicking element(s) 430 and/or cover 440. By way of specific example, the joining material can be an industrial braze alloy, such as BCuP-5, and the sealing process can include placing the assembly with the braze material between wicking element(s) 430 and cover 440 in a belt furnace, and raising the temperature of the assembly within the belt furnace from, for instance, starting room temperature to at or above the melting temperature of the braze alloy. For instance, BCuP-5 has a melting temperature of approximately 800° C., and so, the belt furnace can raise the temperature of the assembly to, for instance, 805° C. or 810° C. peak for a few seconds, after which the furnace is shut down and the assembly is allowed to cool. In one implementation, raising the temperature to 805°-810° C. might require 25-30 minutes, and cooling time may be, for instance, 45-60 minutes.

The sealing process results in the melted, and then cooled, joining material 435' joining the thermally-conductive fins 423 to cover 440 across or at the groove(s) 427 and wicking element(s) 430 in order to, in part, provide a fluid-tight seal of thermally-conductive fins 423 to cover 440, thereby ensuring that coolant flowing through coolant-cooled heat sink 410 between a coolant inlet 441 and a coolant outlet 442 passes through the gaps between the thermally-conductive fins 423, and not over the fins. The migrated joining material 435' along the wicking element(s) 430 results from the melting of the joining material past, sheets or coatings, as noted above in connection with FIG. 4A. In one or more embodiments, wicking element(s) 430 is formed of a material that allows the element to wet with the melting of the joining material, to retain the melted joining material at or along the wicking element(s). This wetting or reacting of the melting joining material and wicking element(s) advantageously inhibits, or even prevents, the joining material from being drawn by capillary action, or otherwise flowing into gaps between the thermally-conductive fins 423. In one or more implementations, joining material 435' is positioned at and drawn along the wicking element(s) 430. As noted, wicking element 430 is formed of a material that allows the element(s) to operate as a wetting or wicking element with melting of the joining material (e.g., brazing material) in order to distribute the joining material across the plurality of thermally-conductive fins, thereby reducing the total surface energy, and preventing the joining material from migrating into the gaps between the fins. This distributing of the joining material across the wicking element also results in a more uniform joining of the top edges of the thermally-conductive fins to the cover. Once cooled, the resultant coolant-cooled structure of FIGS. 4C & 4D is obtained, with the melted and cooled joining material 435' forming a bond or joint between thermally-conductive fins 423 and cover 440 at or across wicking element(s) 430.

Advantageously, the coolant-cooled heat sinks and methods of fabrication disclosed herein decrease and potentially eliminate clogging of the gaps between thermally-conductive fins of the heat transfer base. This is particularly important as the fin spacing pitch continues to decrease. Further, the coolant-cooled heat sink and fabrication processes disclosed can utilize the same brazing facilities and materials as currently practiced, including the braze furnace and alloys, without significant change. There is minimal to no impact to the brazing process and/or profile as practiced, including temperature, braze atmosphere control, etc.

Advantageously, extra surface area is introduced by the grooves and/or wicking elements. The bonding of the joining material to groove surfaces and/or wicking elements reduces the total surface energy of melted joining material above the plurality of thermally-conductive fins. Further, by using small-dimensioned grooves, and small wicking elements, to hold the joining material, the joining material is inhibited, or even prevented, from migrating into the gaps between the plurality of thermally-conductive fins. An additional benefit of adding grooves with wicking elements is an increase in mechanical rigidity of the resultant coolant-cooled heat sink. Further, in one or more implementations, the adding of the grooves to one or both of the surfaces at the cover-to-fin interface provides increased surface area at the interface for holding melted joining material.

FIGS. 5A-5I depict further details of one embodiment of fabricating a coolant-cooled heat sink such as depicted in FIGS. 4A-4D, and described above.

Figure 5A:
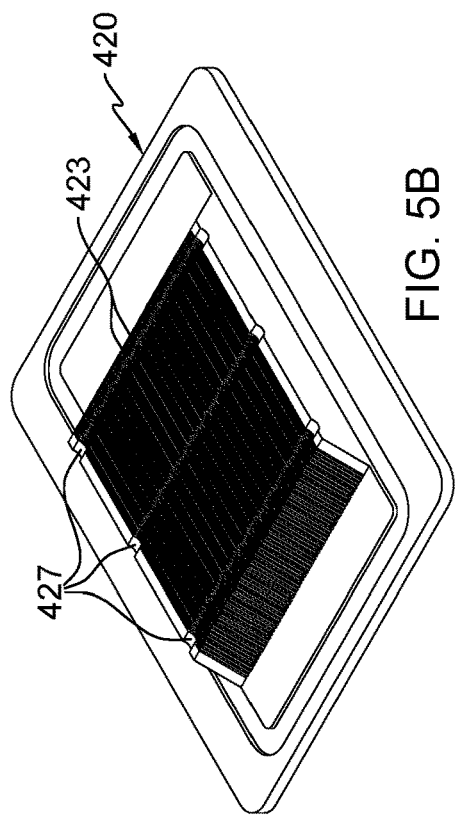
FIG. 5A depicts an intermediate structure in the formation of the heat transfer base such as for the coolant-cooled heat sink of FIGS. 4A-4D, where grooves have been formed in an upper surface of a base region from which the plurality of thermally-conductive fins are to be formed, in accordance with one or more aspects of the present invention.

In FIG. 5A, an intermediate heat transfer base 420 embodiment obtained during heat sink fabrication is shown. As illustrated, circumferential groove 425 has been formed in surface 422, sized and configured to receive an edge of the cover (shown in FIGS. 5C & 5D) to facilitate hermetic sealing of the cover to the heat transfer base 420. Further, a central region 500 of material projects from surface 422 from, or into, which the plurality of thermally-conductive fins are to be formed. In this example, three grooves 427 have been formed in an upper surface 501 of central region 500. In one implementation, grooves 427 substantially extend the full width of upper surface 501 of the central region 500. Note that grooves 427 formed in the upper surface of central region 500 can be of any desired size and configuration as appropriate for a particular joining implementation. In one or more embodiments, grooves 502 have a radius larger than a radius of the wicking element (when used) to reside within the groove. Further, the depth of grooves 427 into central region 500 can vary, depending upon whether the wicking element(s) is to reside more or less within the grooves in the plurality of thermally-conductive fins and/or the grooves in the inner surface of the cover, as noted herein. In one or more embodiments, heat transfer base 420 is a metal structure or plate formed, for instance, of copper or a copper alloy (by way of example only).

Figure 5B:
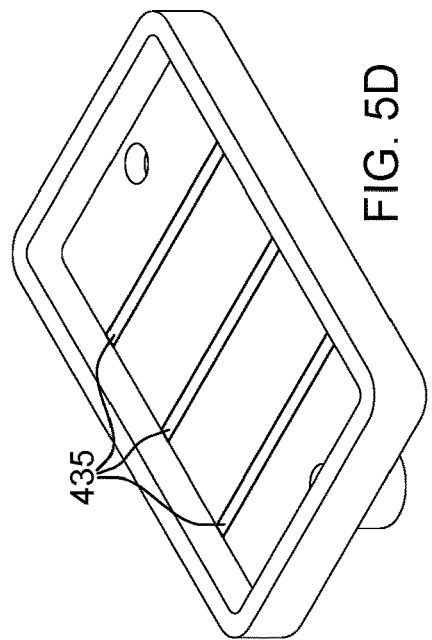
FIG. 5B depicts the heat transfer base of FIG. 5A, after formation of one embodiment of a plurality of thermally-conductive fins, in accordance with one or more aspects of the present invention.

In FIG. 5B, the plurality of thermally-conductive fins 423 have been formed by, for instance, gang-sawing central region 500 to form gaps and define thermally-conductive fins 423 at a desired fin spacing pitch. Note that the resultant heat transfer base 420 embodiment retains grooves 427 extending across the upper surface of the plurality of thermally-conductive fins 423, for instance, extending across the upper surface transverse to the plurality of thermally-conductive fins 423.

Figure 5C:
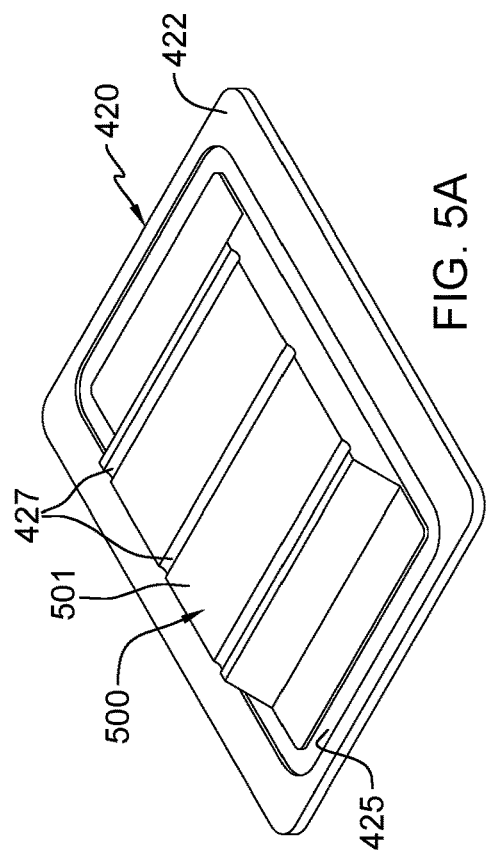
FIG. 5C depicts one embodiment of the inner surface of a cover, such as for the coolant-cooled heat sink of FIGS. 4A-4D, with multiple grooves shown formed in the inner surface, in accordance with one or more aspects of the present invention.
Figure 5D:
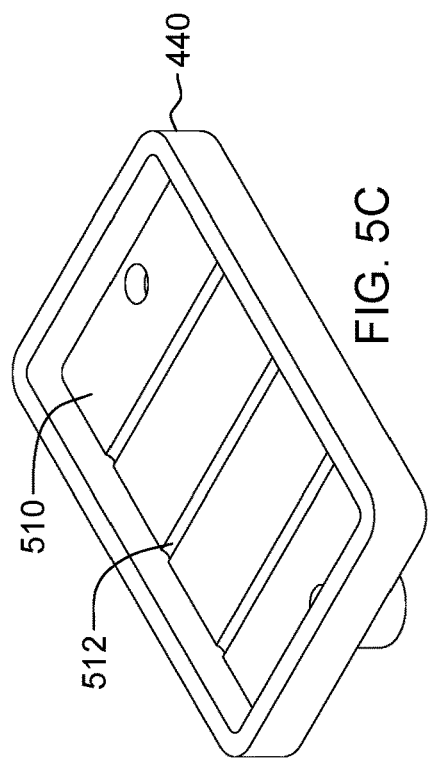
FIG. 5D depicts the cover of FIG. 5C, with a joining material disposed within the grooves in the inner surface of the cover, in accordance with one or more aspects of the present invention.

FIG. 5C depicts one embodiment of cover 440 where, by way of example, three grooves 512 have been formed in inner surface 510 of cover 440 which is to contact, or be in opposing relation to, the upper surface of the plurality of thermally-conductive fins of the heat transfer base. In the embodiment illustrated in FIG. 5D, after forming grooves 512 in inner surface 510 of cover 440, a joining material 435, such as a brazing paste, brazing sheet, or preform, is applied or positioned within openings 512 in inner surface 510 of cover 440.

Figure 5E:
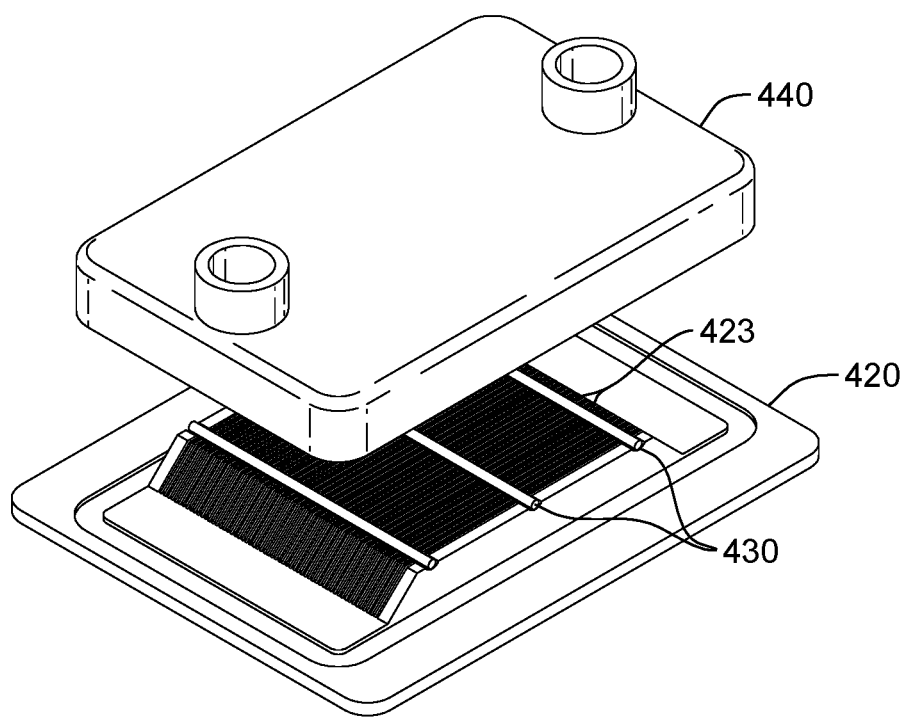
FIG. 5E depicts the coolant-cooled heat sink structure of FIGS. 5A-5D after placement of wicking elements in the grooves formed in the upper surface of the plurality of thermally-conductive fins, in accordance with one or more aspects of the present invention.
Figure 5F:
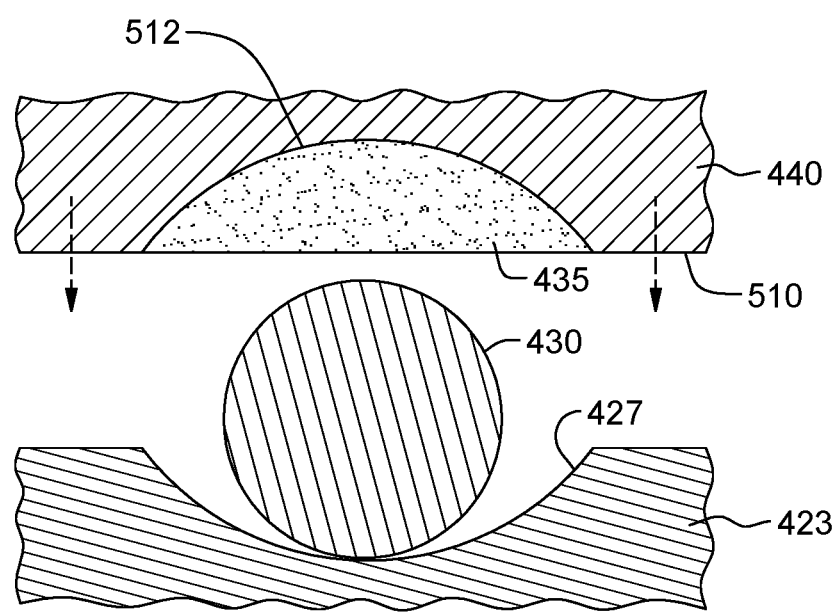
FIG. 5F is a partial illustration of the structure of FIG. 5E, with the cover being moved in position and the grooves in the cover and the upper surface of the thermally-conductive fins aligning to accommodate the wicking element therein, in accordance with one or more aspects of the present invention.
Figure 5G:
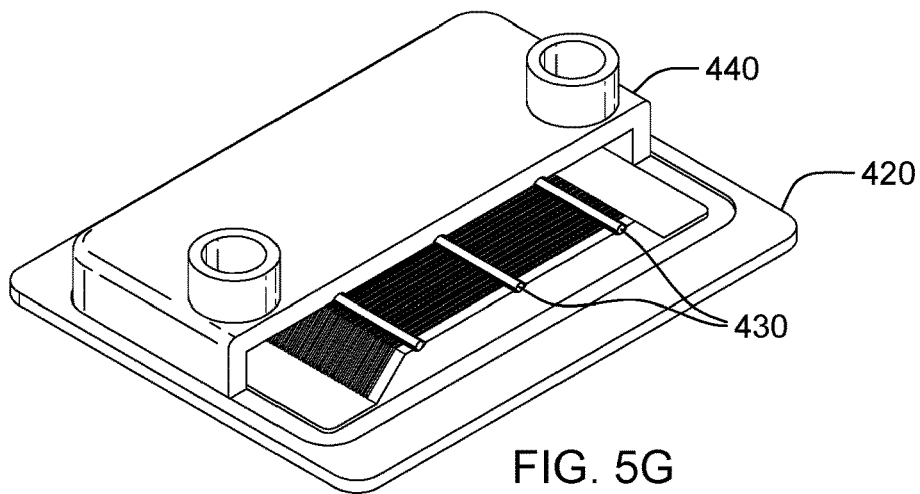
FIG. 5G is a partial cut-away of the coolant-cooled heat sink of FIG. 5E, with the cover in position over the heat transfer base, in accordance with one or more aspects of the present invention.
Figure 5H:
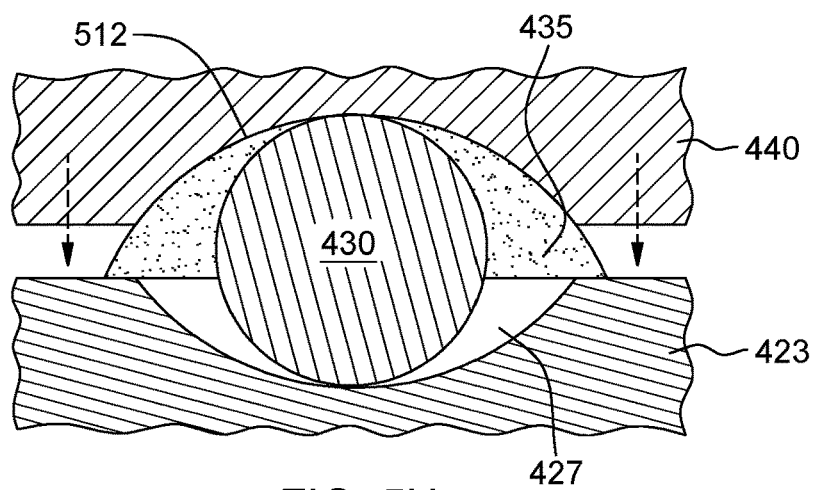
FIG. 5H is a partial depiction of the cover in position over the heat transfer base, and illustrating one embodiment of the joining material migrating with pressing of the cover onto the heat transfer base, in accordance with one or more aspects of the present invention.
Figure 5I:
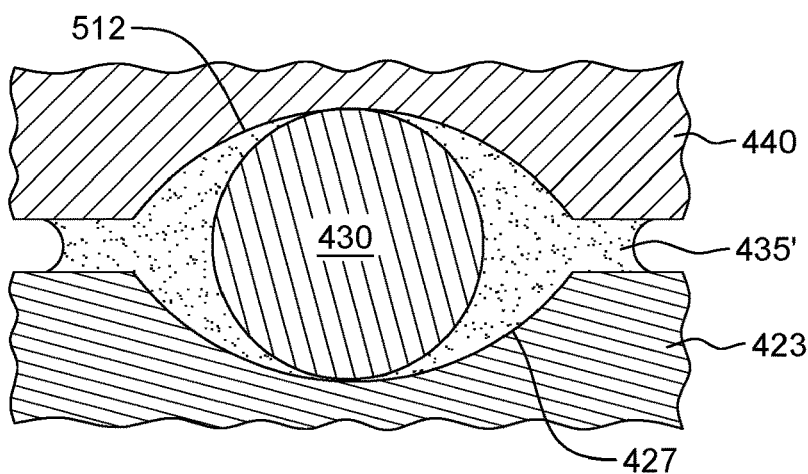
FIG. 5I depicts one embodiment of a resultant joint formed along the wicking element, between the plurality of thermally-conductive fins of the heat transfer base and the cover, after melting of the joining material, in accordance with one or more aspects of the present invention.

In FIG. 5E, wicking elements 430 have been placed in respective grooves in the upper surface of thermally-conductive fins 423 and cover 440 is shown being moved into position. FIG. 5F illustrates positioning of cover 440, with joining material 435 within the grooves 512 in inner surface 510 of cover 440, over the heat transfer base. As illustrated, in one or more embodiments, grooves 427 in the upper surface of thermally conductive fins 423 align with grooves 512 in inner surface 510 of cover 440. A partial cut-away of cover 440 depicts the assembly in FIG. 5G, which is illustrated in greater detail for one set of grooves and wicking element in FIG. 5H. In particular, by pressing cover 440 into contact with heat transfer base 420, joining material 435 can be, at least in part, extruded from groove 512 in cover 440 to, for instance, partially envelop wicking element 430, as illustrated in FIG. 5H. After heating of the heat sink assembly, the joining material flows, in part, into grooves 427 in the plurality of thermally-conductive fins 423 along wicking element 430 to seal cover 440 to the plurality of thermally-conductive fins 423 along or at wicking elements 430, such as illustrated in FIG. 5I.

FIGS. 6A-8 depict various alternate embodiments of a liquid-cooled heat sink, and fabrication process incorporating one or more grooves and one or more wicking elements at the cover-to-fin interface, such as disclosed herein.

Figure 6A:
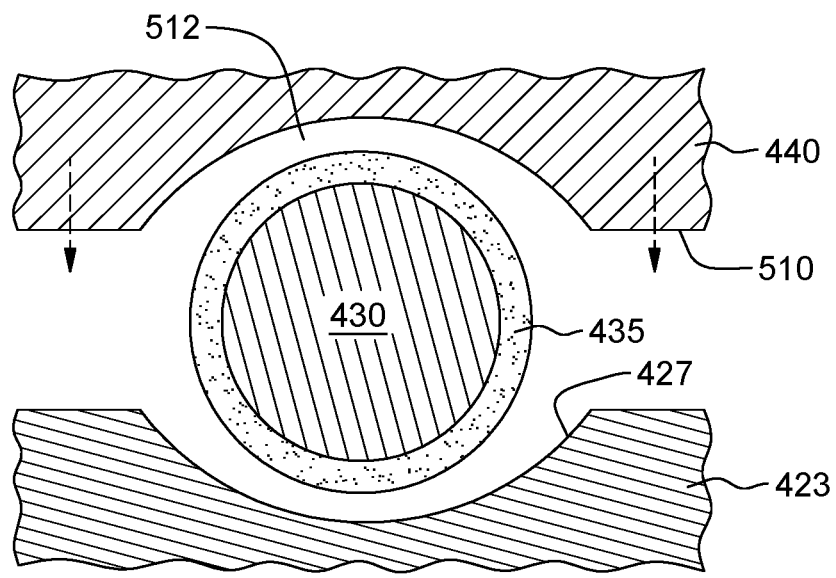
FIG. 6A depicts an alternate embodiment of a joining material provided as a coating on a wicking element, which is accommodated in respective grooves in the plurality of thermally-conductive fins and cover, in accordance with one or more aspects of the present invention.
Figure 6B:
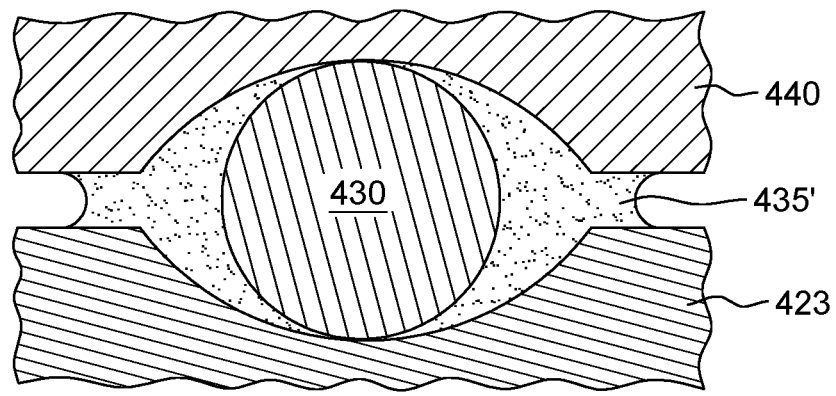
FIG. 6B depicts the structure of FIG. 6A after melting of the joining material to join the plurality of thermally-conductive fins and cover, in accordance with one or more aspects of the present invention.

Referring first to FIGS. 6A & 6B, in one or more embodiments, the joining material 435 can be provided as a coating around the wicking element(s) 430, which as noted above, can be placed into grooves 427 extending across the plurality of thermally-conductive fins 423 of the heat transfer base. In one or more embodiments, grooves 512 in inner surface 510 of cover 440 align with grooves 427 in the plurality of thermally-conductive fins 423 as the cover is moved into operative position in contact with the heat transfer base. FIG. 6A depicts the joining material 435 coating prior to heating, for instance, prior to brazing or soldering, and FIG. 6B depicts an example of the result structure after heating, which can be similar to the resultant structure obtained using the process of FIGS. 5A-5I (in one embodiment). Note that the thickness of joining material coating 435 around wicking element 430 can be adjusted to provide the desired amount of joining material 435' (e.g., braze or solder) connecting the plurality of thermally-conductive fins 423 and cover 440 at or along the wicking element(s) 430. Advantageously, using the process of FIGS. 6A & 6B, separate joining material or paste is not required, nor is it necessary to apply joining material to one or more of the grooves, either in the cover or the plurality of thermally-conductive fins, as part of the assembly process.

FIGS. 7A-7E depict further variations on the coolant-cooled heat sink and fabrication processes of FIGS. 4A-6B.

Figure 7A:
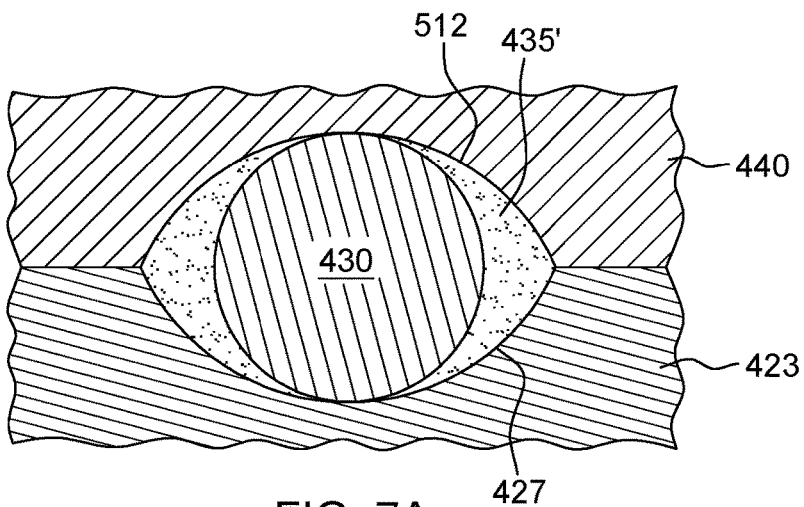
FIG. 7A is a partial illustration of an alternate embodiment of a coolant-cooled heat sink, in accordance with one or more aspects of the present invention.

For instance, FIG. 7A illustrates a resultant coolant-cooled heat sink, where the amount of joining material 435', as well as the size of the wicking element(s) 430, and grooves 427, 512 are such that cover 440 and plurality of thermally-conductive fins 423 are in direct physical contact upon completion of the heating process to melt the joining material.

Figure 7B:
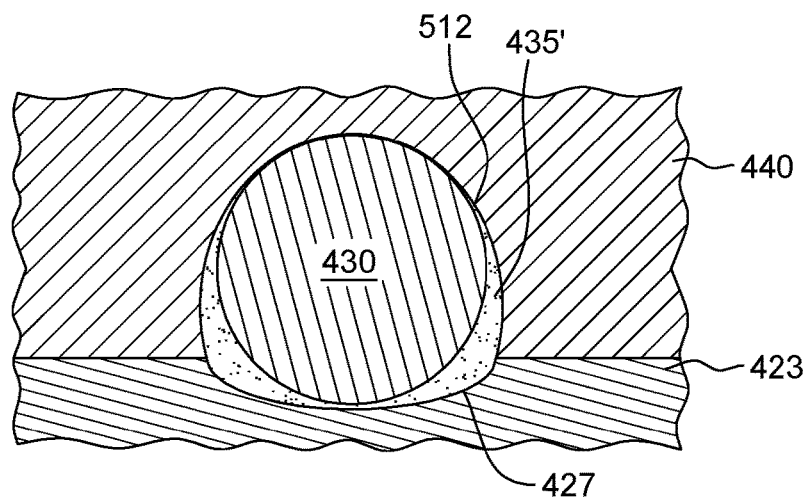
FIG. 7B is a partial illustration of a further embodiment of a coolant-cooled heat sink, in accordance with one or more aspects of the present invention.
Figure 7C:
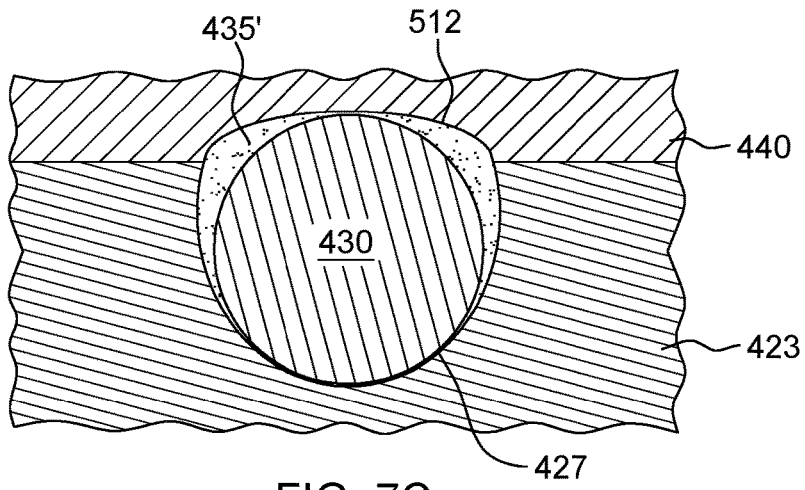
FIG. 7C is a partial illustration of another embodiment of a coolant-cooled heat sink, in accordance with one or more aspects of the present invention.

FIGS. 7B & 7C depict variations where the depth of the respective grooves 427, 512 in the plurality of thermally-conductive fins 423 and cover 440 varies. For instance, in FIG. 7B, groove 512 in the inner surface of cover 440 is larger than, or extends further into the surface than groove 427 in the plurality of thermally-conductive fins 423 of the heat transfer base. In one or more embodiments, the grooves can be sized such that a majority of wicking element 430 resides or extends into the respective groove in cover 440. Advantageously, in one or more embodiments, having the majority of wicking element(s) 430 extending into or residing within grooves 512 in the inner surface of cover 440 reduces the depth to which the wicking element(s) protrudes into the upper surface of the plurality of thermally-conductive fins, and thus, restricts the depth to which the wicking element(s) extends into the gaps between the plurality of thermally-conductive fins. Note that in one embodiment, the wicking element(s) could be, for instance, a 0.75-1.25 mm wire, and thus, even where the wicking element(s) resides substantially equally within the plurality of thermally-conductive fins and the cover, the wicking element(s) only extends into the gaps between the thermally-conductive fins, e.g., approximately 0.5 mm in the case of a 1 mm wire. FIG. 7C depicts another embodiment, where the majority of a wicking element 430 resides or extends into the respective groove 427 in the upper surface of the plurality of thermally-conductive fins 423, if desired for a particular application.

Figure 7D:
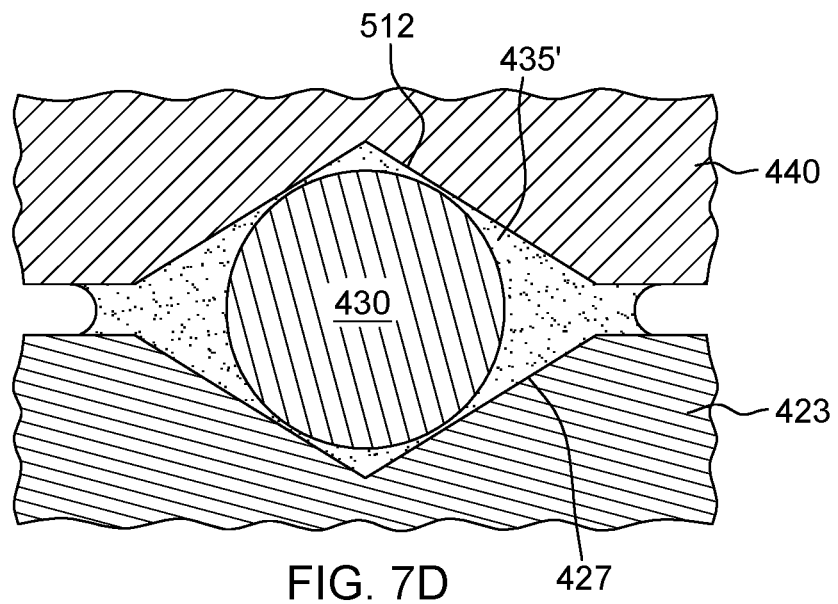
FIG. 7D is a partial illustration of an alternate embodiment of a coolant-cooled heat sink, in accordance with one or more aspects of the present invention.
Figure 7E:
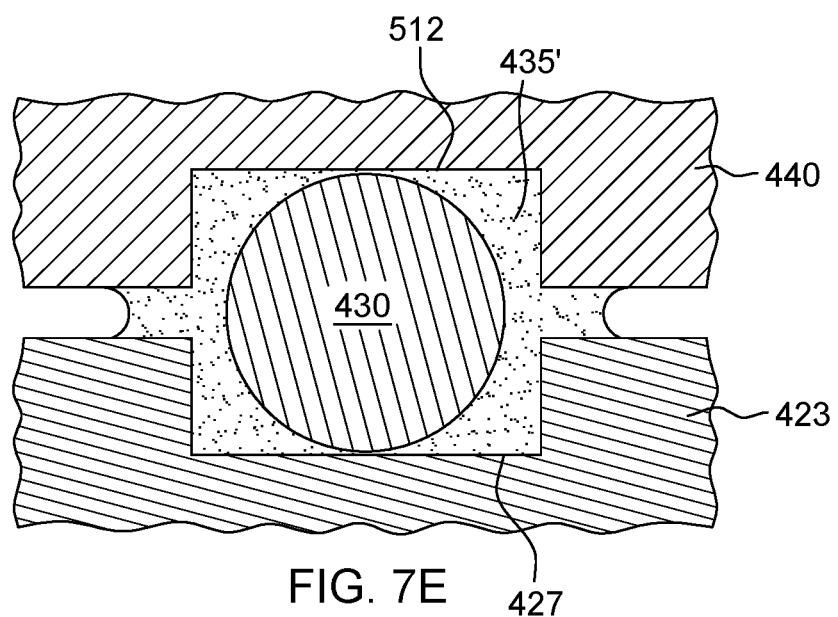
FIG. 7E is a partial depiction of a still further coolant-cooled heat sink, in accordance with one or more aspects of the present invention.

FIGS. 7D & 7E depict alternate heat sink embodiments where the configuration of grooves 427, 512 is varied, with FIG. 7D depicting triangular-shaped grooves, and FIG. 7E depicting rectangular or square-shaped grooves, by way of example only. Note that in one or more other implementations, the configuration of grooves 427 in the upper surface of the plurality of thermally-conductive fins can vary from the configuration of grooves 512 in the inner surface of cover 440, if desired for a particular application.

Figure 8:
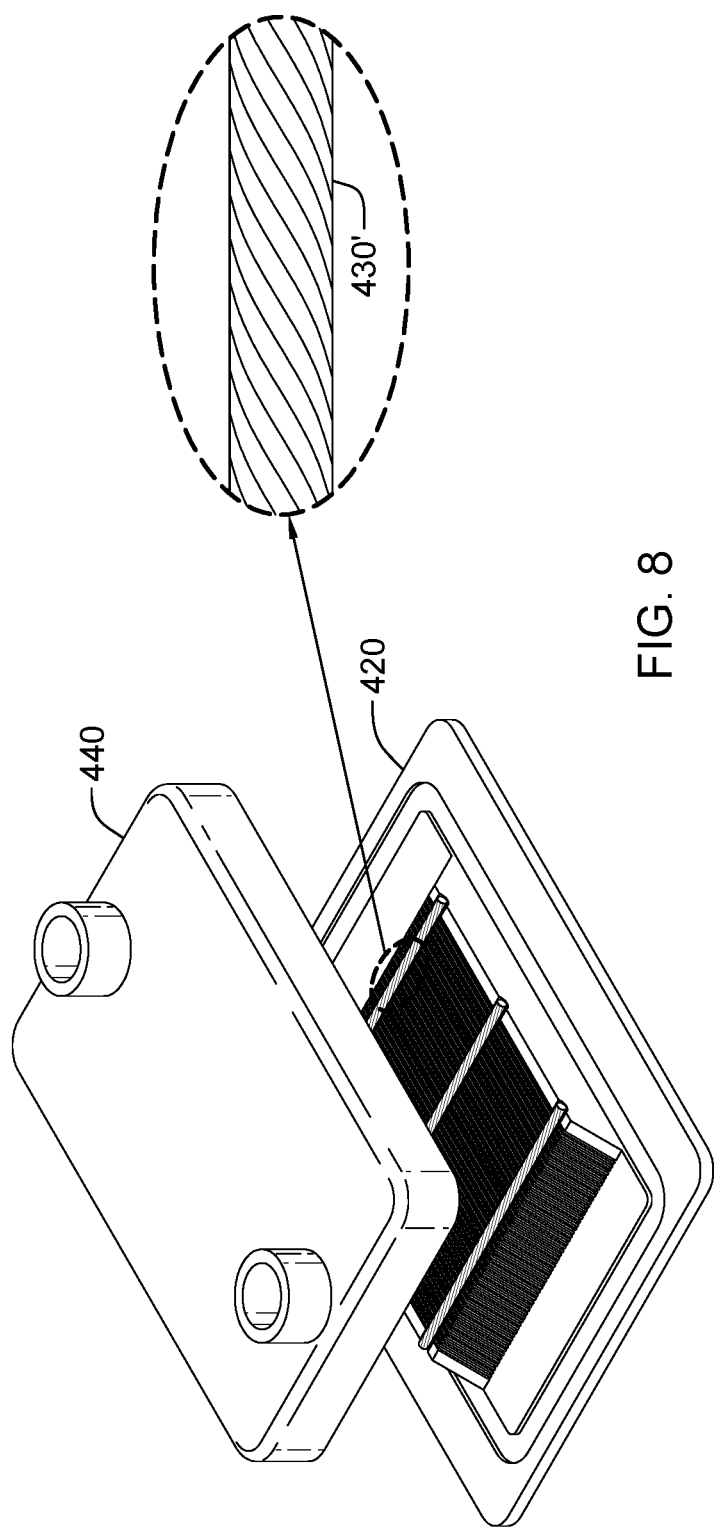
FIG. 8 depicts a further embodiment of a coolant-cooled heat sink similar to that illustrated in FIGS. 4A-4D, with the substitution of braided, wicking elements between the plurality of thermally-conductive fins of the heat transfer base and the cover, in accordance with one or more aspects of the present invention.

FIG. 8 depicts a further embodiment where the wicking elements are, for instance, braided wicking elements 430', such as braided metal wires. The use of braided wicking elements can further facilitate retaining of the joining material in contact with the wicking elements and migrating of the joining material along the wicking elements. Advantageously, metal wires can be employed as the wicking elements, such as the braided wicking elements, to channel or direct the joining materials. The grooves create a preferential joining material flow area at the interface of the upper surface of the thermally-conductive fins and the inner surface of the cover. Advantageously, the structures depicted herein reduce or even eliminate fin clogging during the brazing process, such as during the joining or soldering process, which is especially significant for future heat sink designs as fin spacing pitch continues to be reduced. Further, enhanced structural support is provided by the wicking elements, which can increase the strength of the fin structures and prevent fin bending or buckling during assembly or operation.

Figure 9:
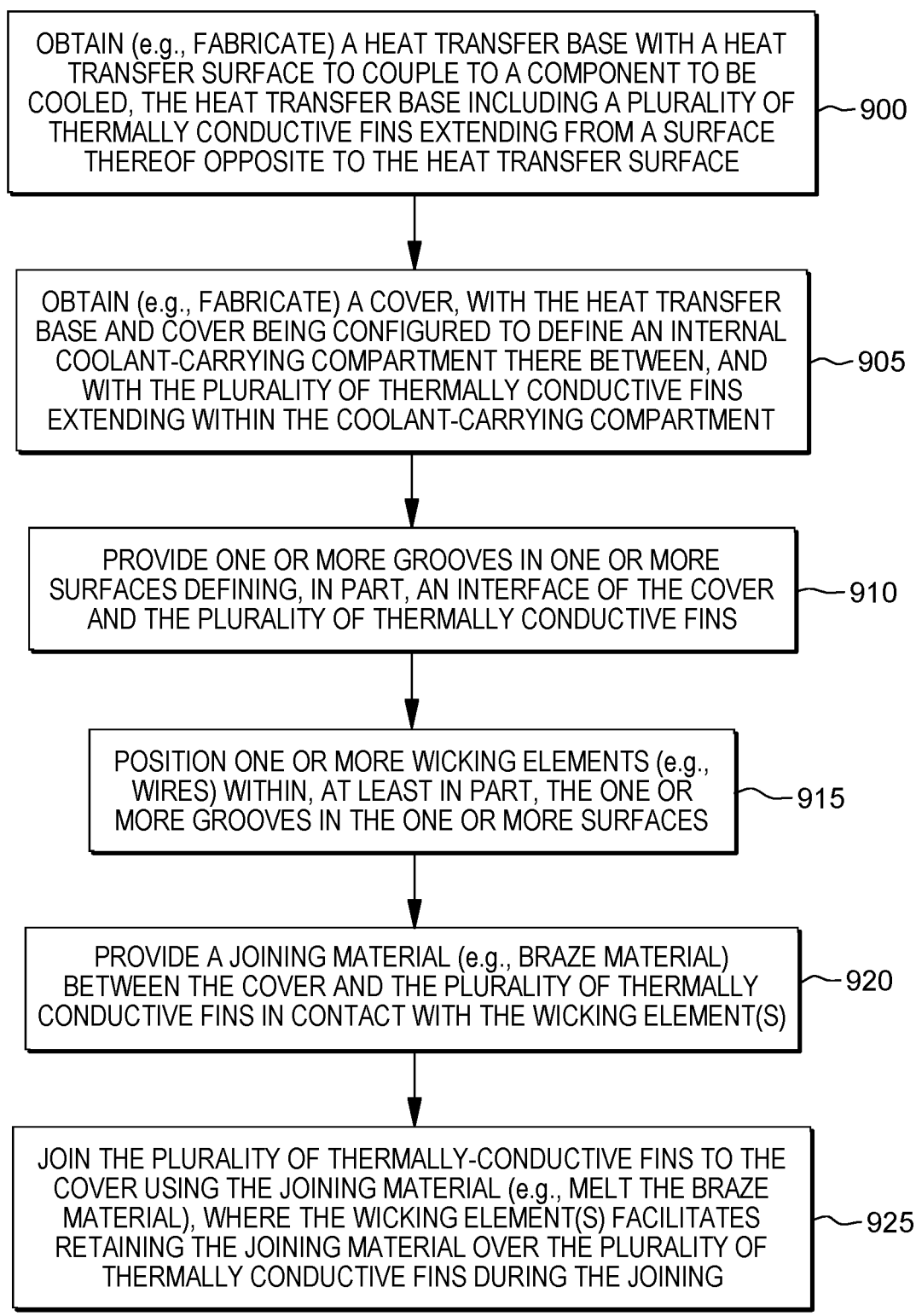
FIG. 9 depicts one embodiment of a process of fabricating a coolant-cooled heat sink, in accordance with one or more aspects of the present invention.

FIG. 9 depicts one embodiment of a process of fabricating a coolant-cooled heat sink, in accordance with one or more aspects of the present invention. As illustrated, a heat transfer base, such as described herein, is obtained or fabricated 900. The heat transfer base can be a metal structure that includes a heat transfer surface to couple to one or more components to be cooled, such as one or more electronic components to be cooled. Further, a plurality of thermally-conductive fins are provided (e.g., machined) to extend from a surface of the heat transfer base opposite to the heat transfer surface. A cover is also obtained or fabricated 905, with the heat transfer base and cover being configured to define an internal coolant-carrying compartment between the cover and base, with the plurality of thermally-conductive fins extending into the coolant-carrying compartment. One or more grooves in one or more surfaces defining, in part, an interface of the cover and the plurality of thermally-conductive fins are provided 910. As noted herein, the one or more surfaces refers to, for instance, one or more of the upper surface of the plurality of thermally-conductive fins and the inner surface of the cover, which are in close opposing relation, or in contact, when the cover is operatively positioned and secured to the heat transfer base. One or more wicking elements (e.g., wires) are positioned within, at least in part, the one or more grooves in the one or more surfaces 915, and a joining material (e.g., braze or solder material) is provided between the cover and the plurality of thermally-conductive fins in contact with the wicking element(s) 920. Note in this regard, that, in one or more embodiments, the joining material(s) are provided before positioning the wicking element(s) in the groove(s) in the one or more surfaces The plurality of thermally-conductive fins are joined to the cover using the joining material (e.g., the braze material is melted), where the wicking element(s) facilitate retaining the joining material over the plurality of thermally-conductive fins during the joining 925.

Advantageously, the presence of the wicking element(s) and groove(s) facilitates inhibiting the joining material from migrating into gaps between adjacent thermally-conductive fins during the joining process. Small reservoirs are created along the wicking element(s) to trap excess joining material during the joining process. Also, the extra surfaces introduced by the groove(s) and wicking element(s) are designed to wet or react with the joining material, for instance, after the material melts, as part of the joining process. The bonding of the joining material to the wicking element(s) advantageously reduces the total surface energy of the material, inhibiting or preventing the joining material from migrating into the underlying gaps between adjacent thermally-conductive fins. Further, the addition of the wicking element(s) such as disclosed herein over the thermally-conductive fins, also facilitates increasing mechanical rigidity of the coolant-cooled heat sink by, for instance, dispersing the melted joining material more evenly across the interface between thermally conductive fins and the cover. For instance, the wicking elements are designed to direct the joining material laterally above the thermally conductive fins, further mitigating or eliminating fin clogging during the joining process.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form contain, such as "contains" and "containing") are open-ended linking verbs. As a result, a method or device that "comprises", "has", "includes" or "contains" one or more steps or elements possesses those one or more steps or elements, but is not limited to possessing only those one or more steps or elements. Likewise, a step of a method or an element of a device that "comprises", "has", "includes" or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of one or more aspects of the invention and the practical application, and to enable others of ordinary skill in the art to understand one or more aspects of the invention for various embodiments with various modifications as are suited to the particular use contemplated.

What is claimed is:

1. A method comprising:
   providing a coolant-cooled heat sink with a coolant-carrying compartment between a cover and a heat transfer base, the heat transfer base including a heat transfer surface to couple to a component to be cooled, and the heat transfer base including a plurality of thermally-conductive fins extending into the coolant-carrying compartment from a surface of the heat transfer base opposite to the heat transfer surface, the providing comprising:
      providing at least one groove in a surface defining, in part, an interface of the cover and the plurality of thermally-conductive fins, the surface being an inner surface of the cover or an upper surface of the plurality of thermally-conductive fins;
      providing at least one wicking element within, at least in part, the at least one groove;
      providing a joining material between the cover and the plurality of thermally-conductive fins in contact with the at least one wicking element; and
      joining the plurality of thermally-conductive fins to the cover at the interface using the joining material, where the at least one wicking element within, at least in part, the at least one groove in the surface at the interface of the cover and the plurality of thermally-conductive fins facilitates retaining the joining material over the plurality of thermally-conductive fins during the joining.

2. The method of claim 1, wherein the joining comprises applying heat to melt the joining material, with the melted joining material wetting the at least one wicking element, and migrating, at least in part, along the at least one wicking element within the at least one groove in the surface.

3. The method of claim 2, wherein the at least one wicking element comprises at least one metal wire, and the joining material is a brazing material.

4. The method of claim 3, wherein the at least one metal wire comprises at least one braided metal wire.

5. The method of claim 1, wherein providing the at least one groove in the surface defining, in part, the interface between the cover and the plurality of thermally-conductive fins comprises providing the at least one groove in the upper surface of the plurality of thermally-conductive fins.

6. The method of claim 5, wherein providing the at least one groove in the upper surface of the plurality of thermally-conductive fins comprises providing the at least one groove to extend across the upper surface of the plurality of thermally-conductive fins.

7. The method of claim 6, further comprising;
   providing at least one groove in the inner surface of the cover overlying the plurality of thermally-conductive fins when the cover is operatively coupled to the heat transfer base, wherein a groove of the at least one groove in the upper surface of the plurality of thermally-conductive fins aligns with a groove of the at least one groove in the inner surface of the cover, and wherein a wicking element of the at least one wicking element resides in part within the groove in the upper surface of the plurality of thermally-conductive fins, and in part in the groove in the inner surface of the cover with joining of plurality of thermally-conductive fins and the cover.

8. The method of claim 7, wherein the groove in the upper surface of the plurality of thermally-conductive fins, and the groove in the inner surface of the cover are configured and sized such that a greater portion of the wicking element resides within the groove in the inner surface of the cover than within the groove in the upper surface of the plurality of thermally-conductive fins.

9. The method of claim 1, wherein providing the at least one groove in the surface defining, in part, the interface between the cover and the plurality of thermally-conductive fins comprises providing the at least one groove in the inner surface of the cover to overlie the plurality of thermally-conductive fins.

10. The method of claim 9, wherein providing the at least one groove in the inner surface of the cover comprises providing the at least on groove to extend across an upper surface of the plurality of thermally-conductive fins when the cover is operatively positioned in contact with the heat transfer base.

11. The method of claim 1, further comprising:
providing multiple grooves in the surface defining, in part, the interface of the cover and the plurality of thermally-conductive fins, the at least one groove being at least one groove of the multiple grooves;
providing multiple wicking elements, each wicking element residing, at least in part, within a respective groove of the multiple grooves, the at least one wicking element being at least one wicking element of the multiple wicking elements; and
wherein the multiple wicking elements residing, at least in part, within the multiple grooves in the surface at the interface of the cover and the plurality of thermally-conductive fins facilitate wicking and retaining of joining material over the plurality of thermally-conductive fins during the joining.

12. The method of claim 11, wherein the surface defining, in part, the interface between the cover and the plurality of thermally-conductive fins is the inner surface of the cover, and wherein the method further comprises:
providing multiple grooves in the upper surface of the plurality of thermally-conductive fins at the interface between the cover and the plurality of thermally-conductive fins, a groove of the multiple grooves in the upper surface of the plurality of thermally-conductive fins aligning with a groove of the multiple grooves in the inner surface of the cover; and
wherein a wicking element of the multiple wicking elements resides, in part, within a respective groove of the multiple grooves in the upper surface of the plurality of thermally-conductive fins, retaining the wicking element in position between the cover and the plurality of thermally-conductive fins.

13. An apparatus comprising:
a coolant-cooled heat sink with a coolant-carrying compartment, the coolant-cooled heat sink comprising:
a heat transfer base with a heat transfer surface to couple to a component to be cooled, the heat transfer base including a plurality of thermally-conductive fins extending into the coolant-carrying compartment from a surface of the heat transfer base opposite to the heat transfer surface;
a cover sealed to the heat transfer base, the heat transfer base and cover defining, at least in part, the coolant-carrying compartment therebetween;
at least one wicking element disposed in at least one groove in a surface at an interface of the cover and the plurality of thermally-conductive fins, the at least one groove overlying, at least in part, the plurality of thermally-conductive fins, the surface being an inner surface of the cover or an upper surface of the plurality of thermally-conductive fins; and
a joining material contacting the at least one wicking element and residing, at least in part, within the at least one groove, the joining material joining the plurality of thermally-conductive fins to the cover.

14. The apparatus of claim 13, wherein the at least one wicking element comprises at least one braided metal wire, and the joining material is a brazing material.

15. The apparatus of claim 13, wherein the at least one groove is disposed in the upper surface of the plurality of thermally-conductive fins, and extends across the upper surface of the plurality of thermally-conductive fins.

16. The apparatus of claim 15, further comprising:
at least one groove at the inner surface of the cover overlying the plurality of thermally-conductive fins, wherein a groove of the at least one groove in the upper surface of the plurality of thermally-conductive fins aligns with a groove of the at least one groove in the inner surface of the cover, and a wicking element of the at least one wicking element resides in part within the groove in the upper surface of the plurality of thermally-conductive fins, and in part in the groove in the inner surface of the cover.

17. The apparatus of claim 16, wherein the groove in the upper surface of the plurality of thermally-conductive fins, and the groove in the inner surface of the cover are configured and sized such that a greater portion of the wicking element resides within the groove in the inner surface of the cover than within the groove in the upper surface of the plurality of thermally-conductive fins.

18. The apparatus of claim 13, wherein the at least one groove is in the inner surface of the cover overlying the plurality of thermally-conductive fins, and the at least one groove in the inner surface of the cover extends across an upper surface of the plurality of thermally-conductive fins.

19. An apparatus comprising:
a heat-generating electronic component;
a coolant-cooled heat sink comprising:
a heat transfer base with a heat transfer surface coupled to the heat-generating electronic component, the heat transfer base including a plurality of thermally-conductive fins extending into a coolant-carrying compartment of the coolant-cooled heat sink, from a surface of the heat transfer base opposite to the heat transfer surface;
a cover sealed to the heat transfer base, the heat transfer base and the cover defining, at least in part, the coolant-carrying compartment therebetween;
at least one wicking element disposed in at least one groove in a surface at an interface of the cover and the plurality of thermally-conductive fins, the surface being an inner surface of the cover or an upper surface of the plurality of thermally-conductive fins, and the at least one groove overlying, at least in part, the plurality of thermally-conductive fins; and
a joining material contacting at least one wicking element and residing, at least in part, within the at least one groove, the joining material joining the plurality of thermally-conductive fins to the cover.

20. The apparatus of claim 19, wherein the at least one wicking element comprises at least one metal wire, and the joining material is a brazing material.

* * * * *